US008120085B2

(12) United States Patent
Sugioka

(10) Patent No.: US 8,120,085 B2
(45) Date of Patent: Feb. 21, 2012

(54) SEMICONDUCTOR DEVICE AND METHOD FOR MANUFACTURING THE SAME

(75) Inventor: Shigeru Sugioka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 445 days.

(21) Appl. No.: 12/320,571

(22) Filed: Jan. 29, 2009

(65) Prior Publication Data

US 2009/0194814 A1 Aug. 6, 2009

(30) Foreign Application Priority Data

Jan. 30, 2008 (JP) ................................. 2008-019041

(51) Int. Cl.
*H01L 27/108* (2006.01)
(52) U.S. Cl. ................. 257/302; 257/E27.091; 438/259
(58) Field of Classification Search .................. 257/296, 257/301–305, E27.091; 438/238, 239, 243, 438/253, 259, 586, 595
See application file for complete search history.

(56) References Cited

U.S. PATENT DOCUMENTS

| | | | | |
|---|---|---|---|---|
| 5,225,697 A | * | 7/1993 | Malhi et al. ..................... | 257/302 |
| 5,307,310 A | * | 4/1994 | Narita ............................. | 365/149 |
| 5,497,017 A | * | 3/1996 | Gonzales ........................ | 257/306 |
| 5,736,761 A | * | 4/1998 | Risch et al. .................... | 257/301 |
| 5,929,477 A | * | 7/1999 | McAllister Burns et al. | 257/306 |
| 6,426,252 B1 | * | 7/2002 | Radens et al. ................. | 438/243 |
| 6,504,200 B2 | * | 1/2003 | Schlosser et al. ............. | 257/301 |
| 6,627,940 B1 | * | 9/2003 | Schumann et al. ........... | 257/301 |
| 6,762,099 B1 | * | 7/2004 | Yu-Sheng et al. ............ | 438/270 |
| 6,808,987 B2 | * | 10/2004 | Hsiao et al. .................... | 438/257 |
| 7,064,373 B2 | * | 6/2006 | Goebel et al. ................. | 257/301 |

FOREIGN PATENT DOCUMENTS

| | | |
|---|---|---|
| JP | 5-121693 | 5/1993 |
| JP | 7-273221 | 10/1995 |
| JP | 2002-541667 | 12/2002 |

* cited by examiner

*Primary Examiner* — William F Kraig
(74) *Attorney, Agent, or Firm* — McGinn IP Law Group, PLLC

(57) ABSTRACT

A semiconductor device includes: a channel region extending substantially perpendicular to a main surface of a semiconductor substrate; a first diffusion layer provided on a bottom of the channel region; a second diffusion layer provided on a top of the channel region; a first gate electrode that extends substantially perpendicular to the main surface of the semiconductor substrate and that is provided on a side of the channel region through a gate insulation film; and a second gate electrode that extends substantially parallel to the main surface of the semiconductor substrate and that is connected to the top of the first gate electrode, wherein a planar position of the second gate electrode is offset relative to a planar position of the first gate electrode.

11 Claims, 31 Drawing Sheets

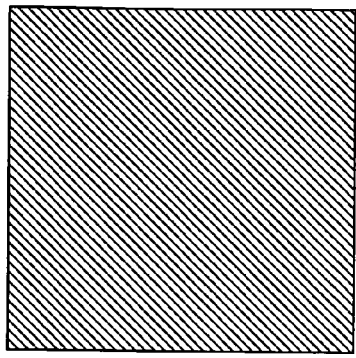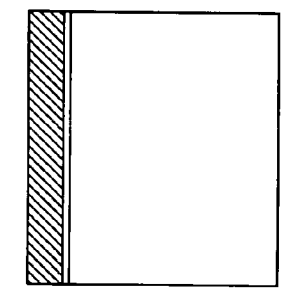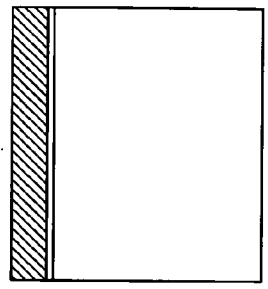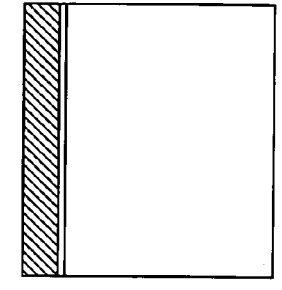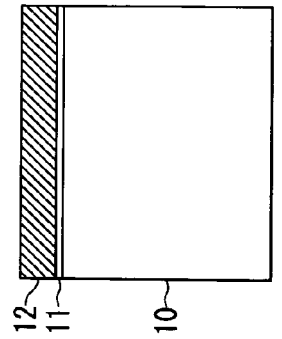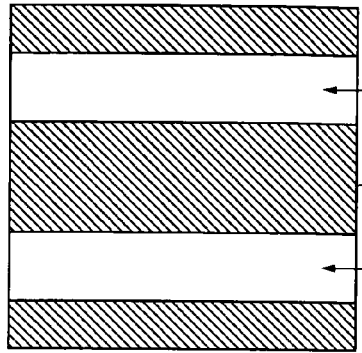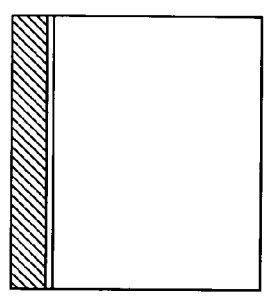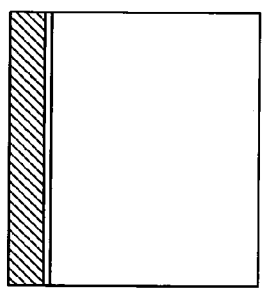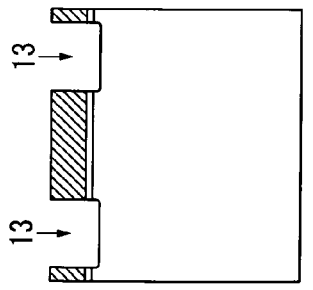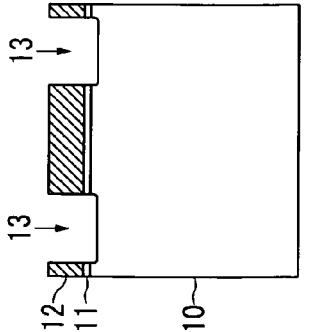

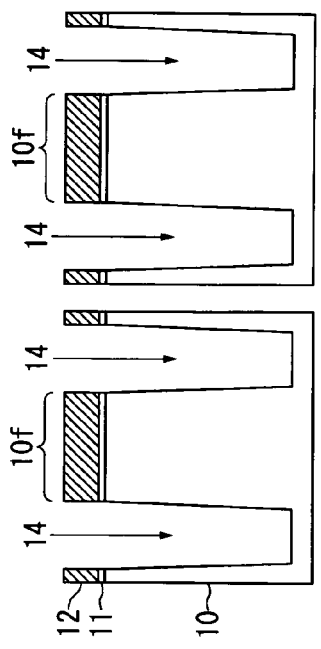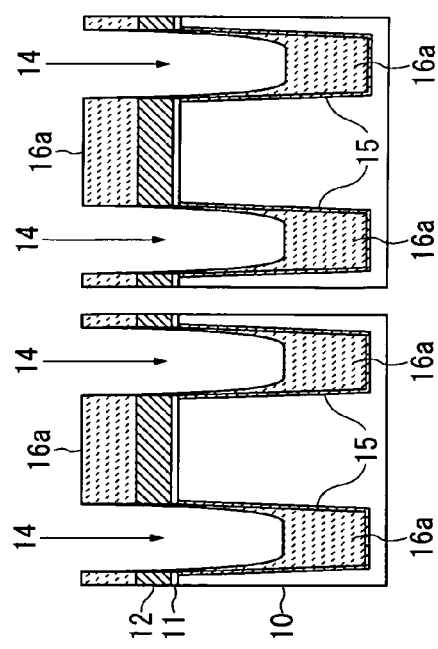

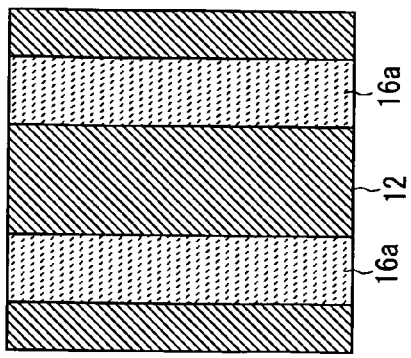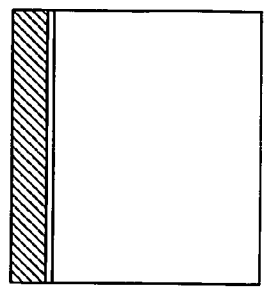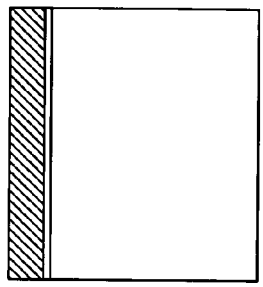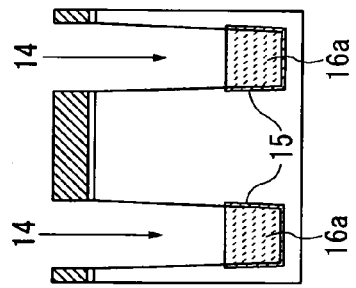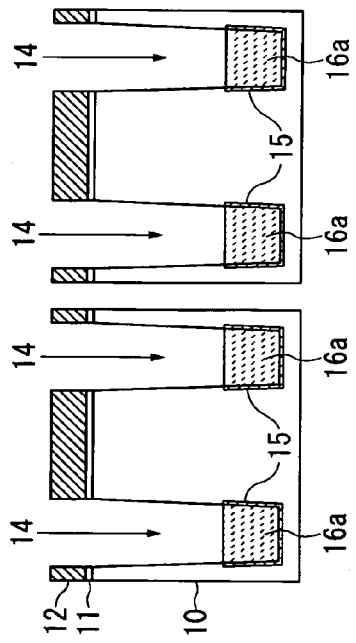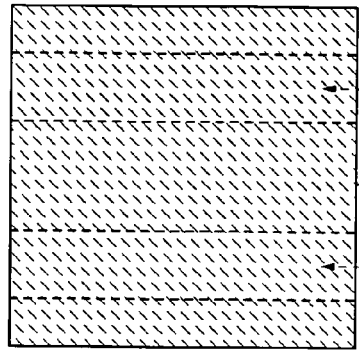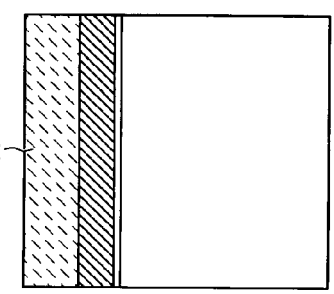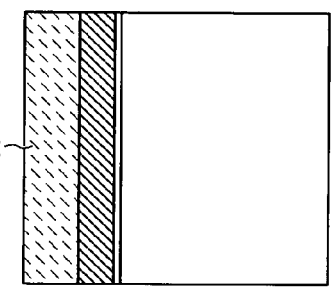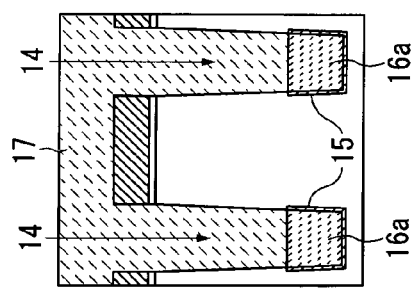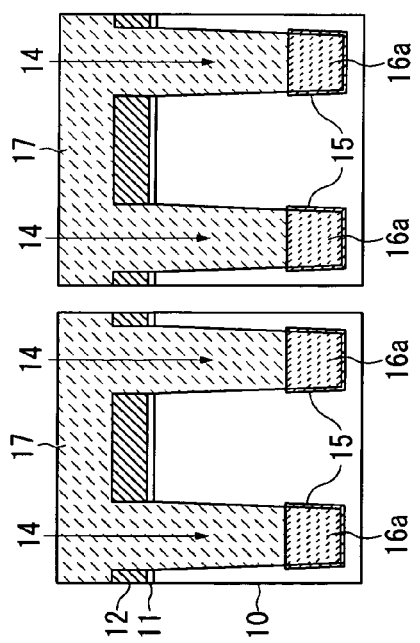

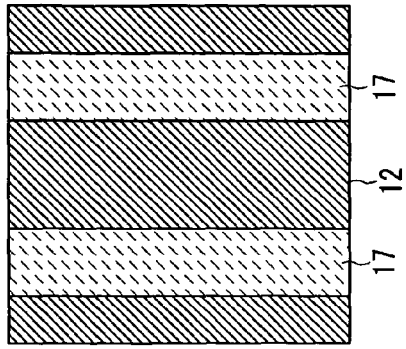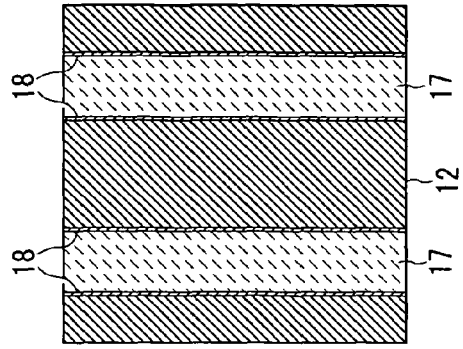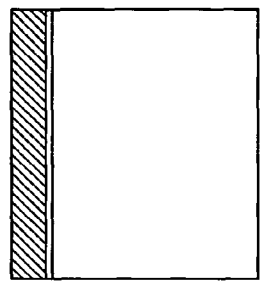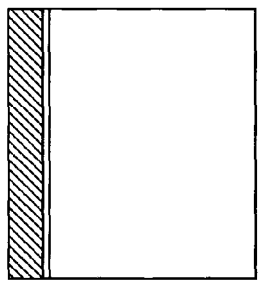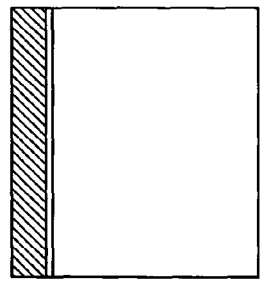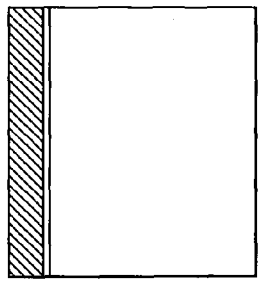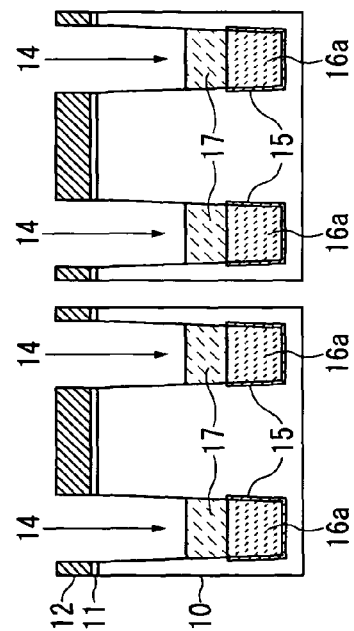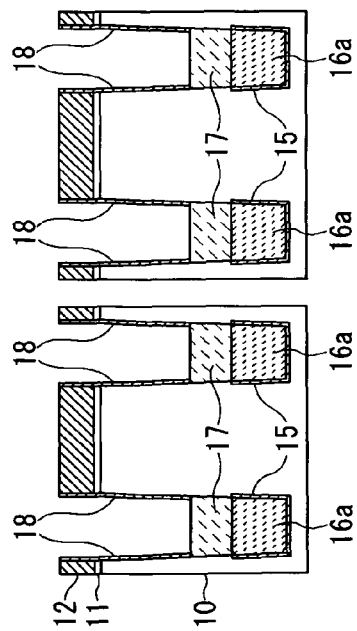

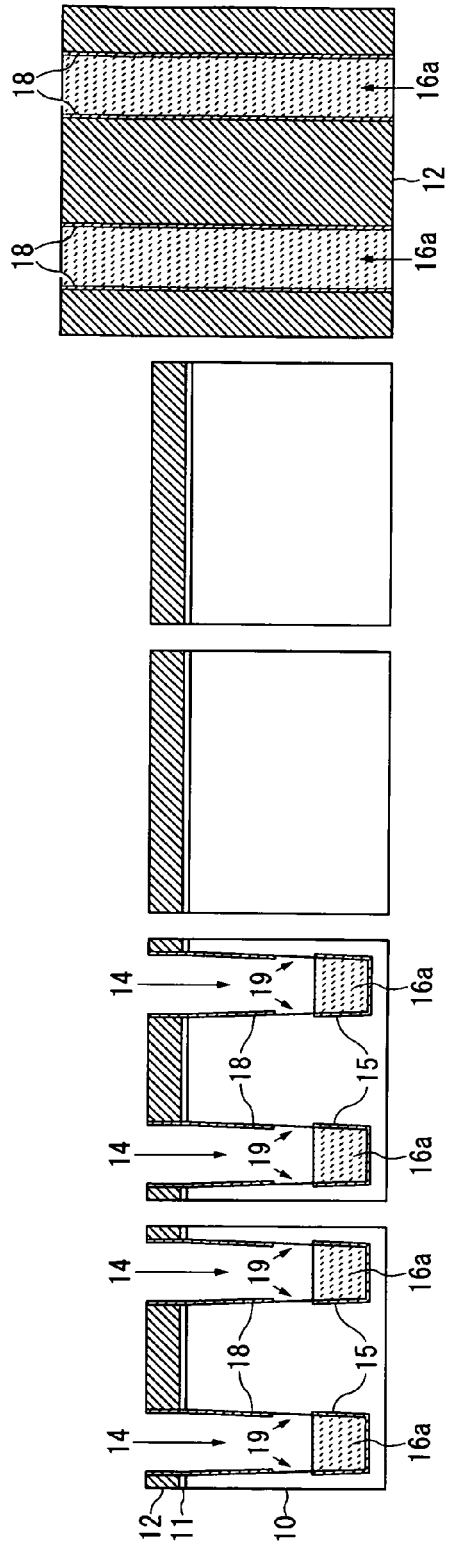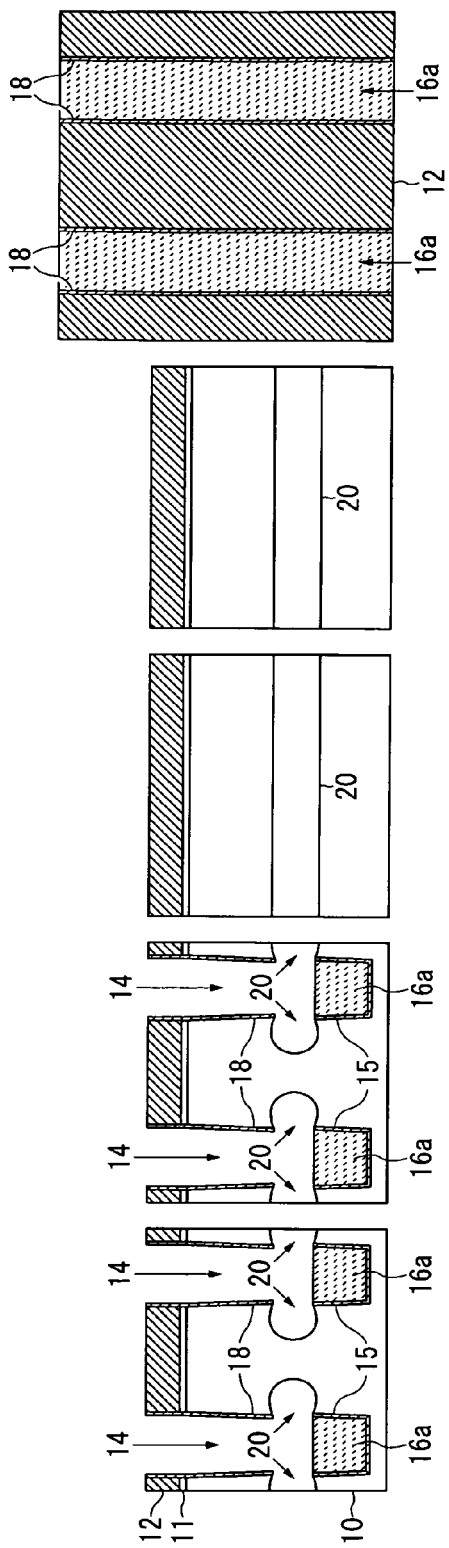

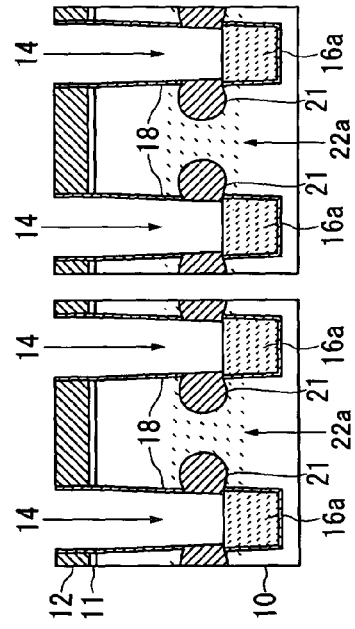
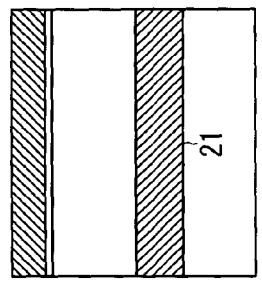
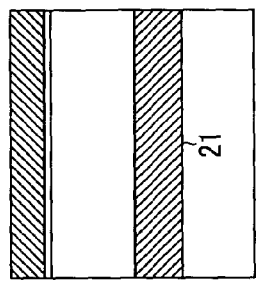
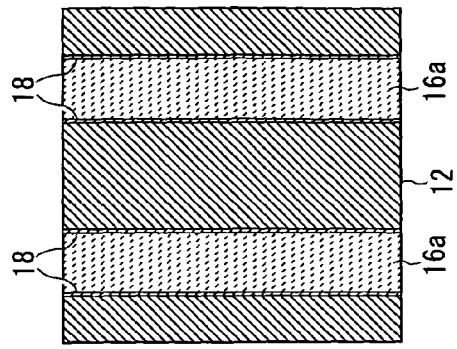
FIG.16A FIG.16B FIG.16C FIG.16D FIG.16E
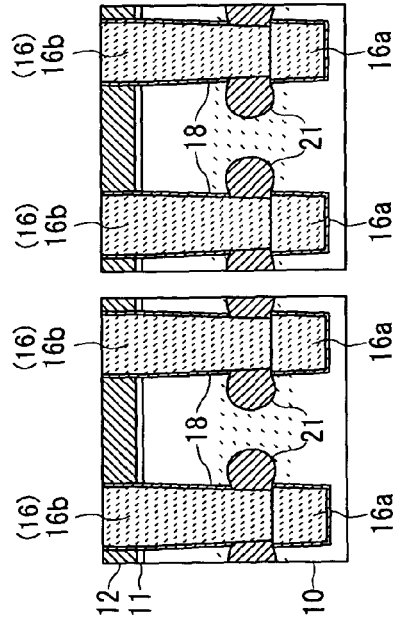
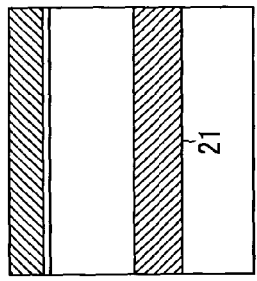
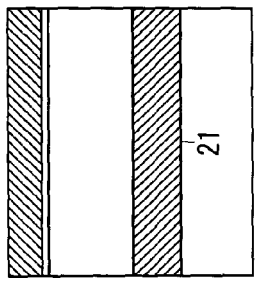
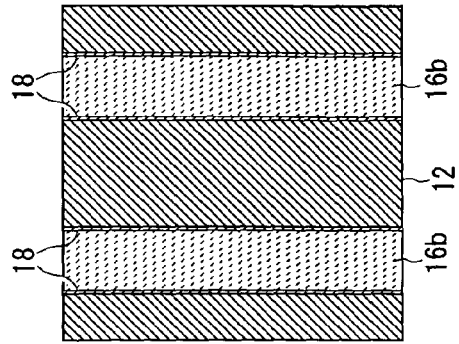
FIG.17A FIG.17B FIG.17C FIG.17D FIG.17E

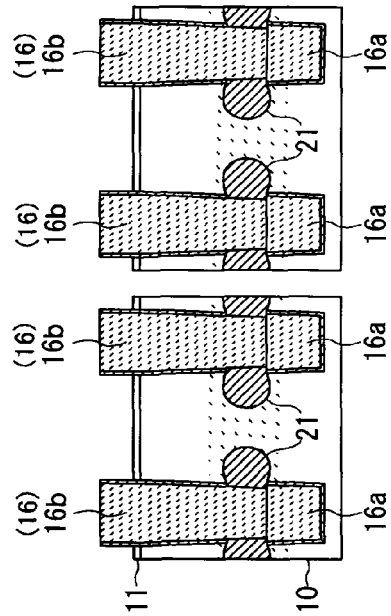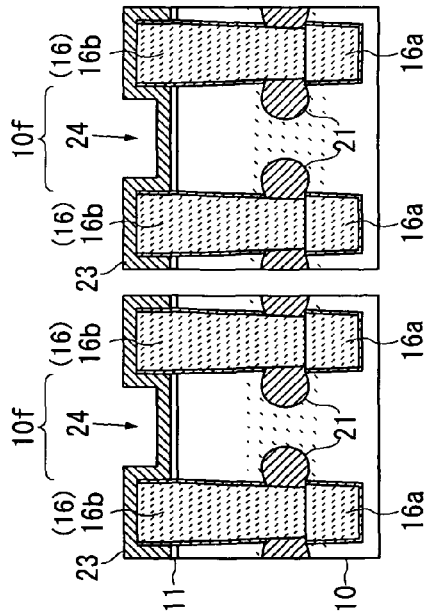

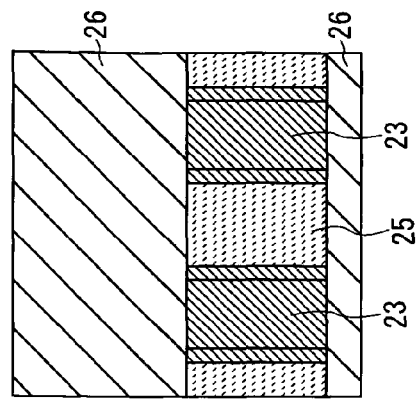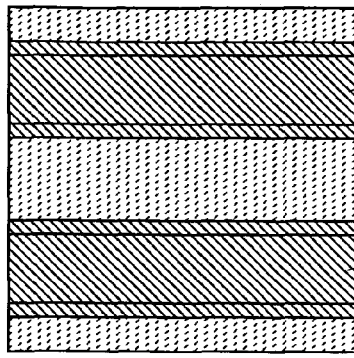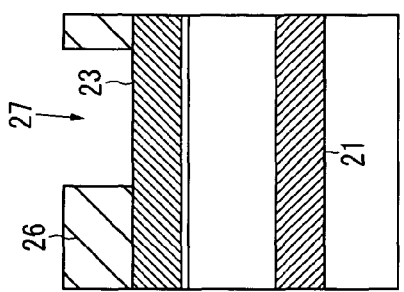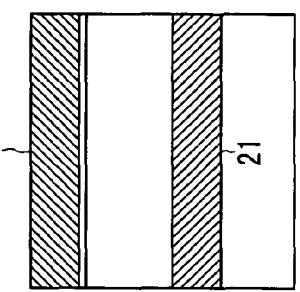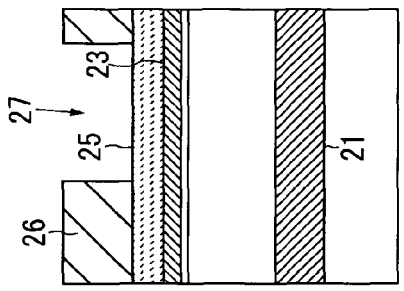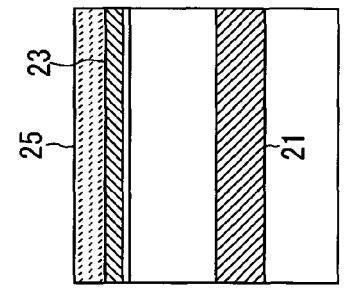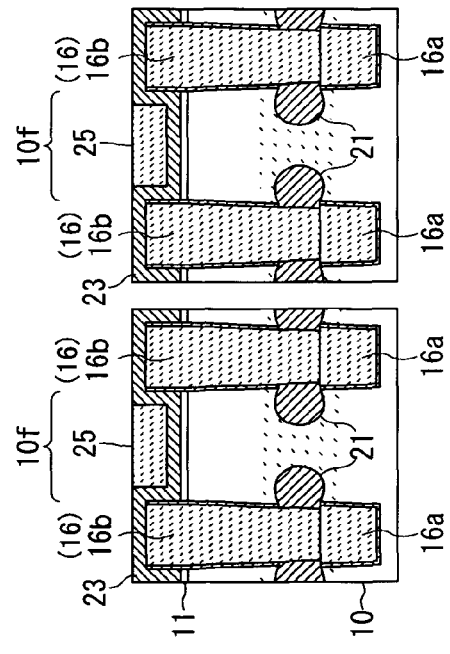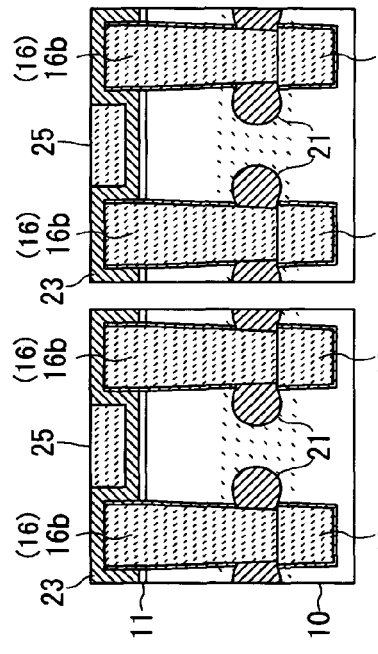

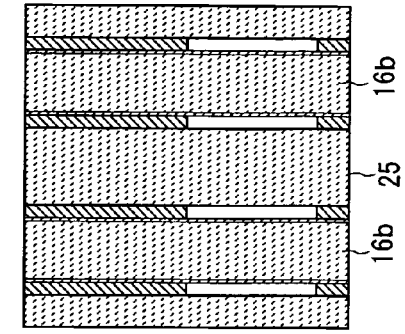
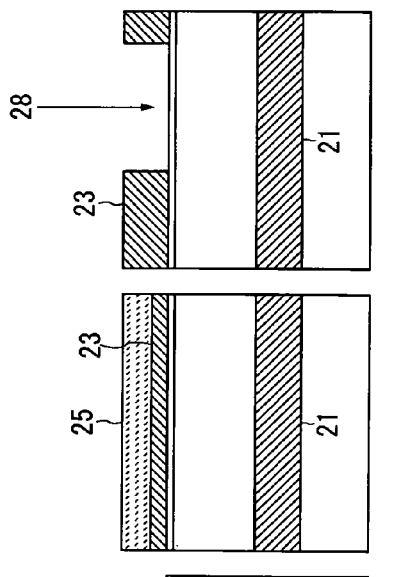
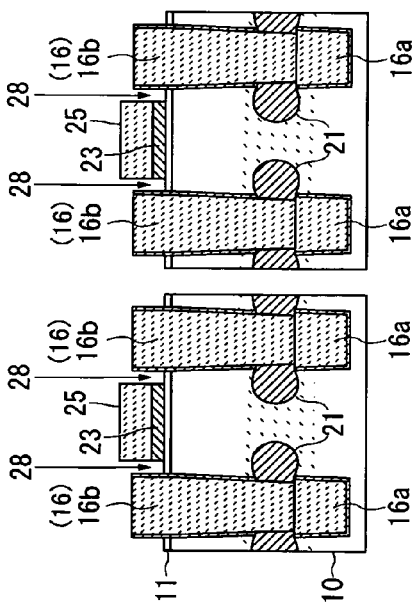
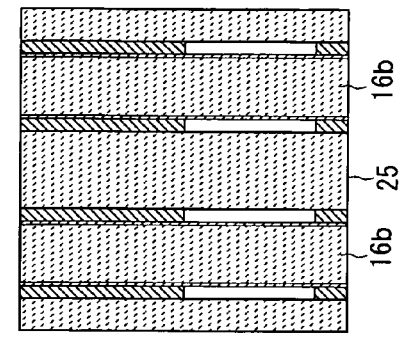
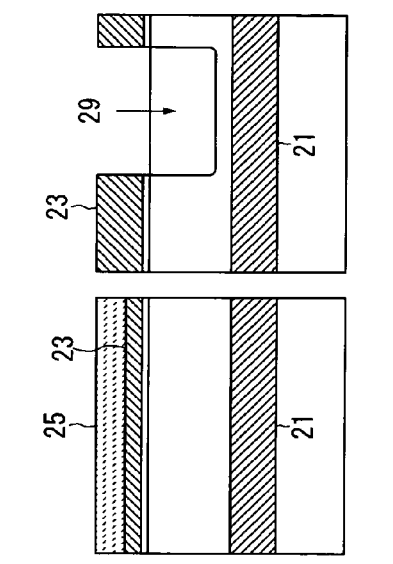
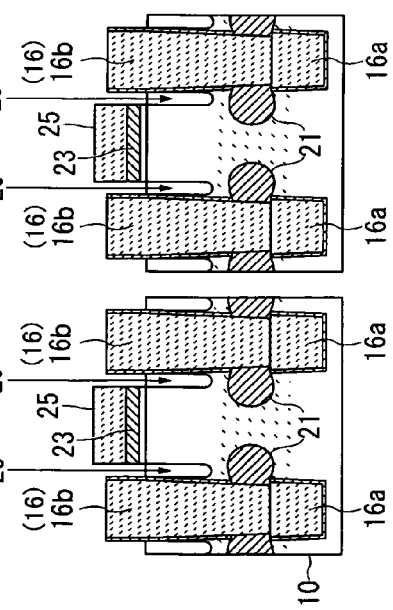

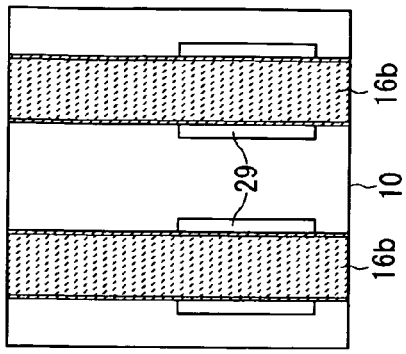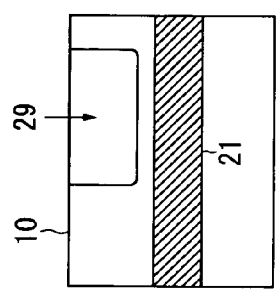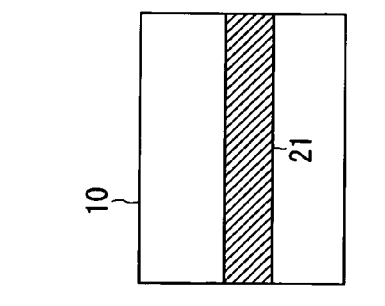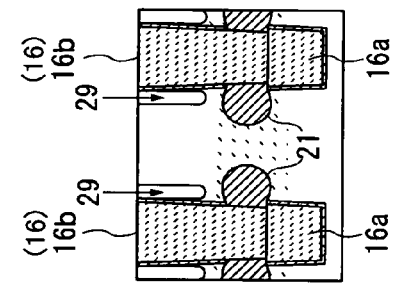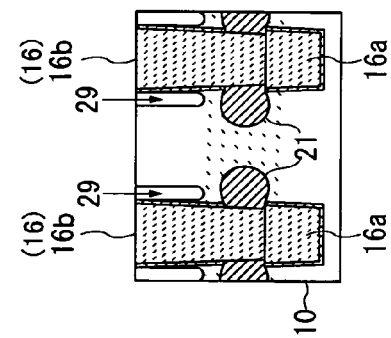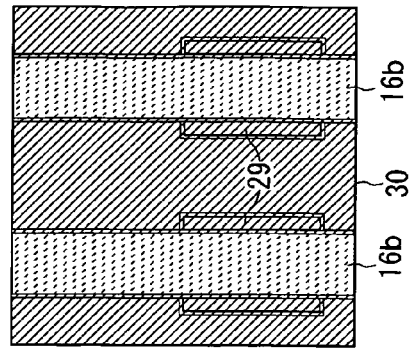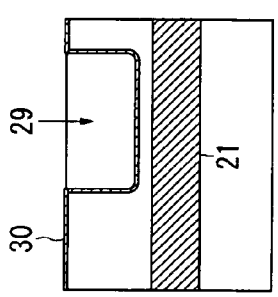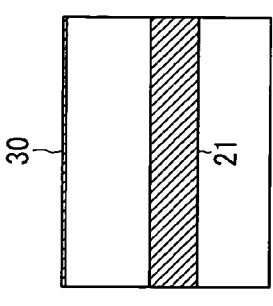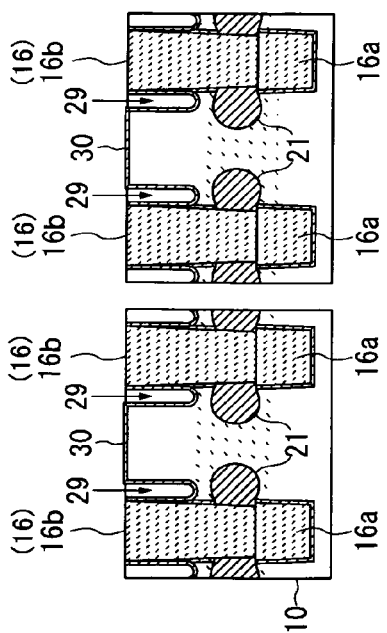

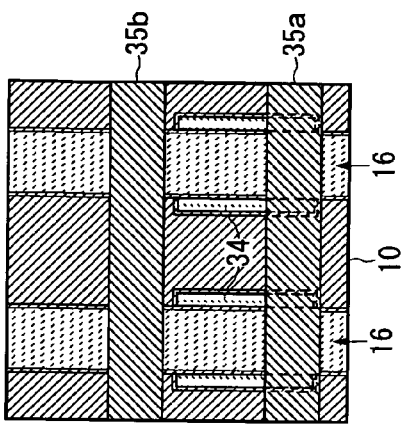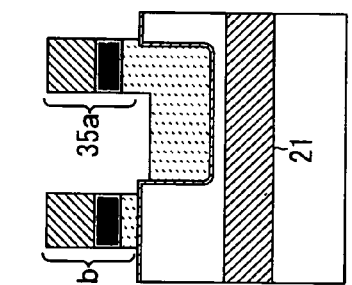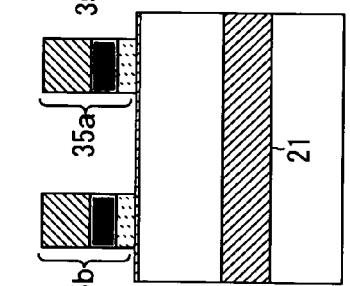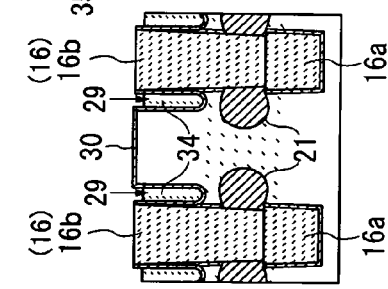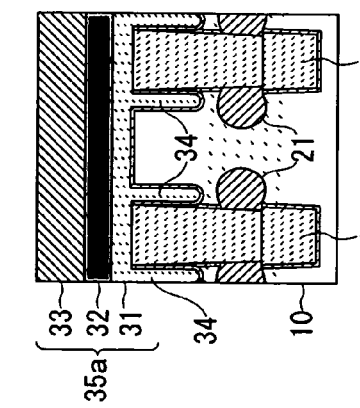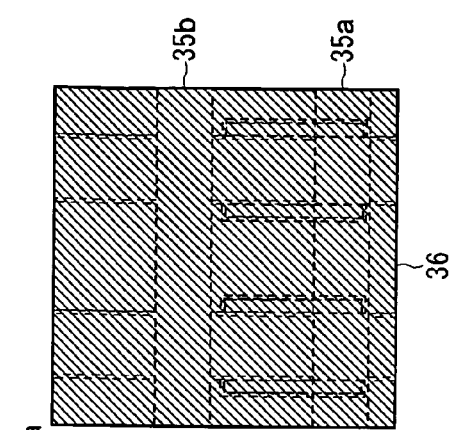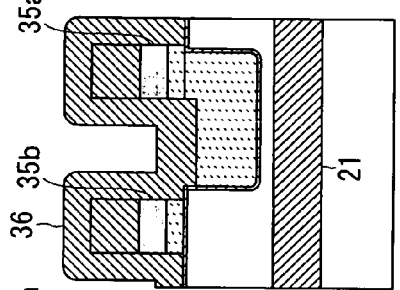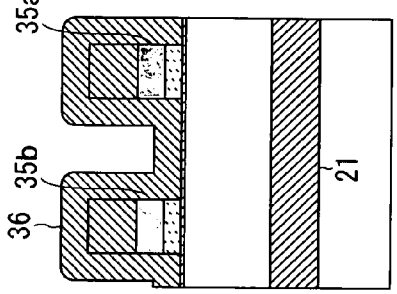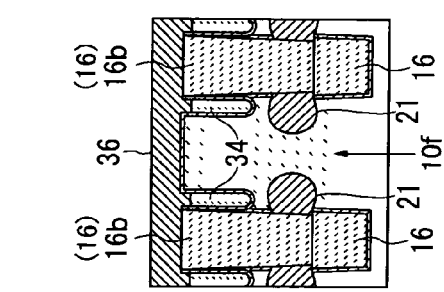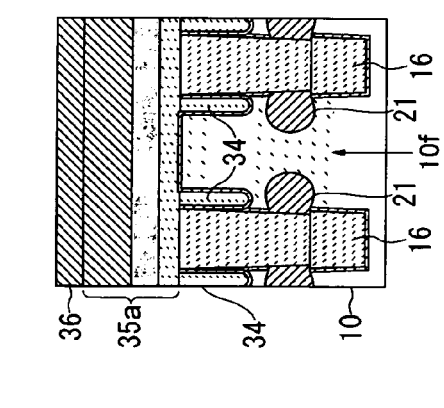

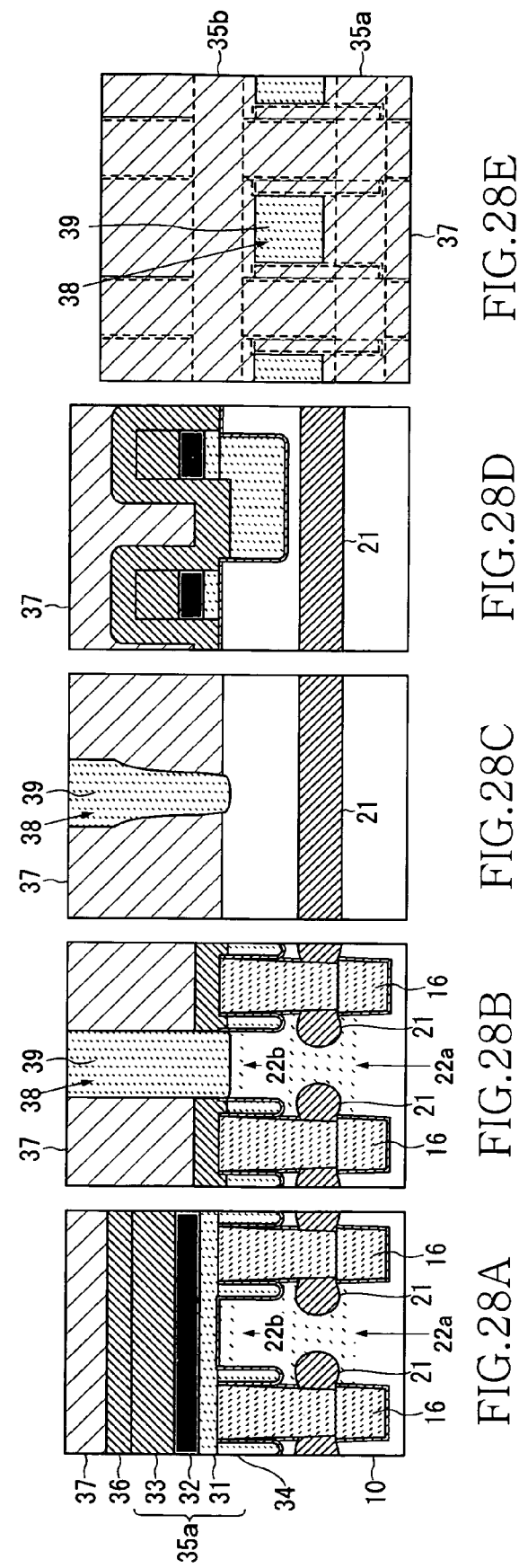

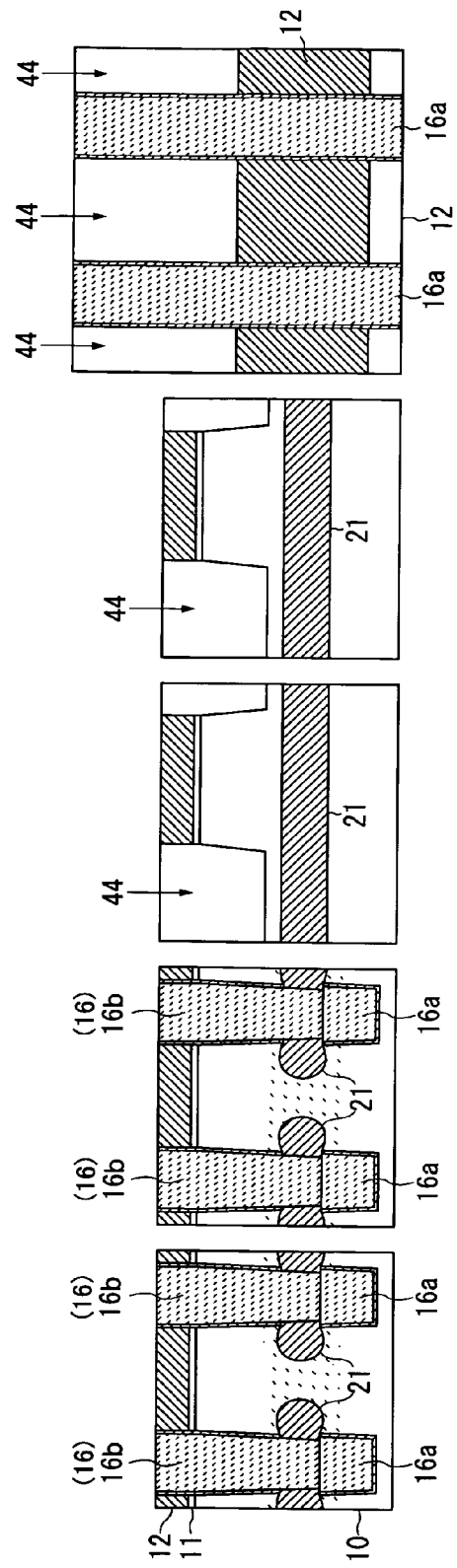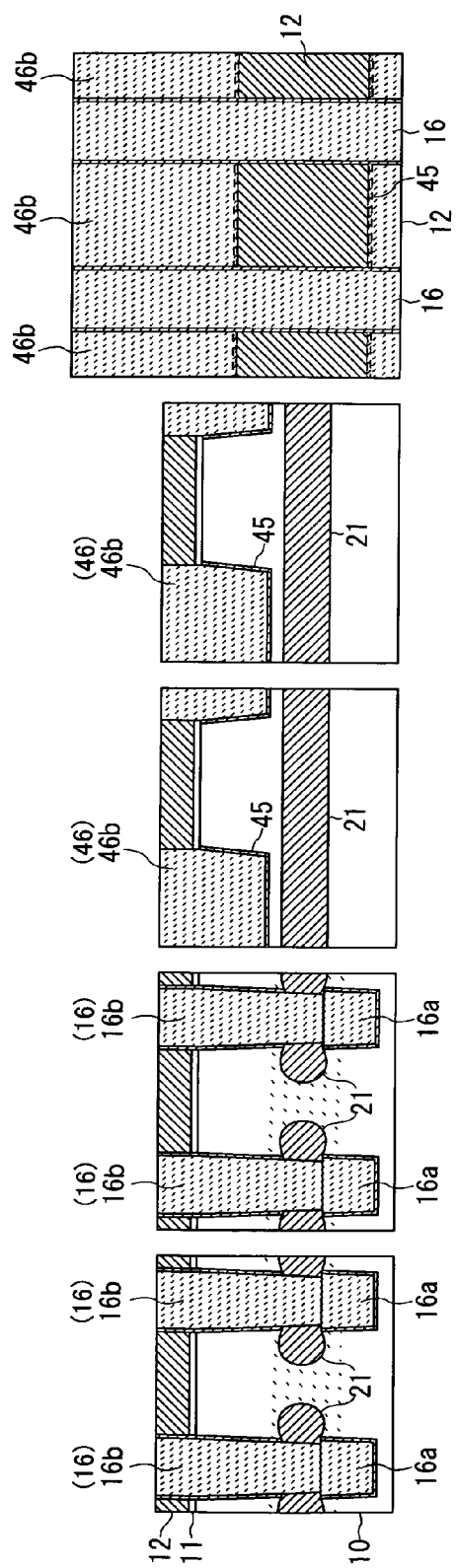

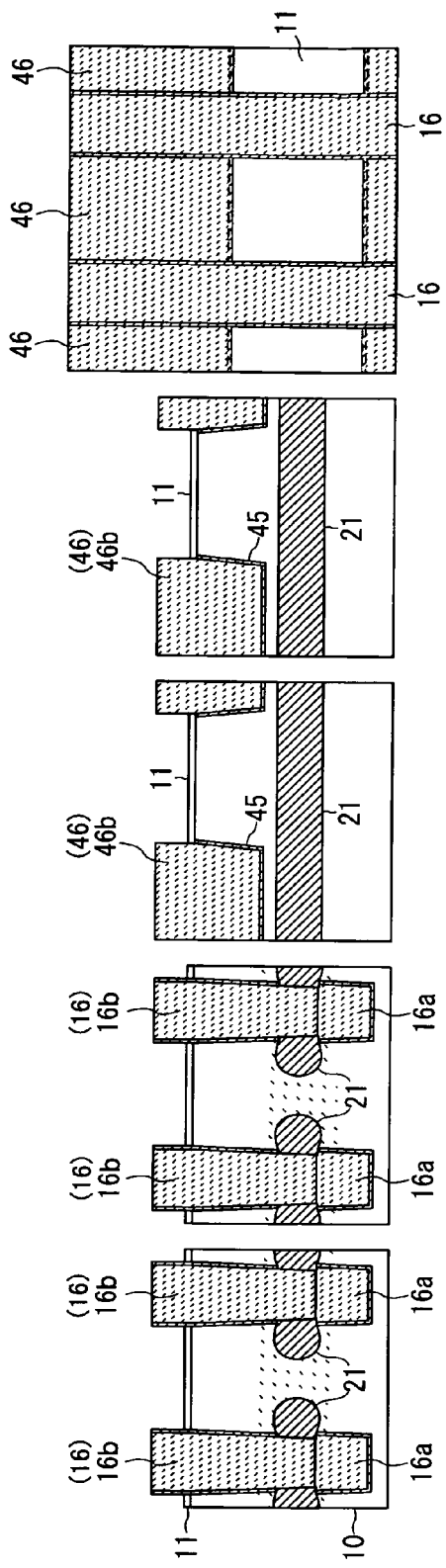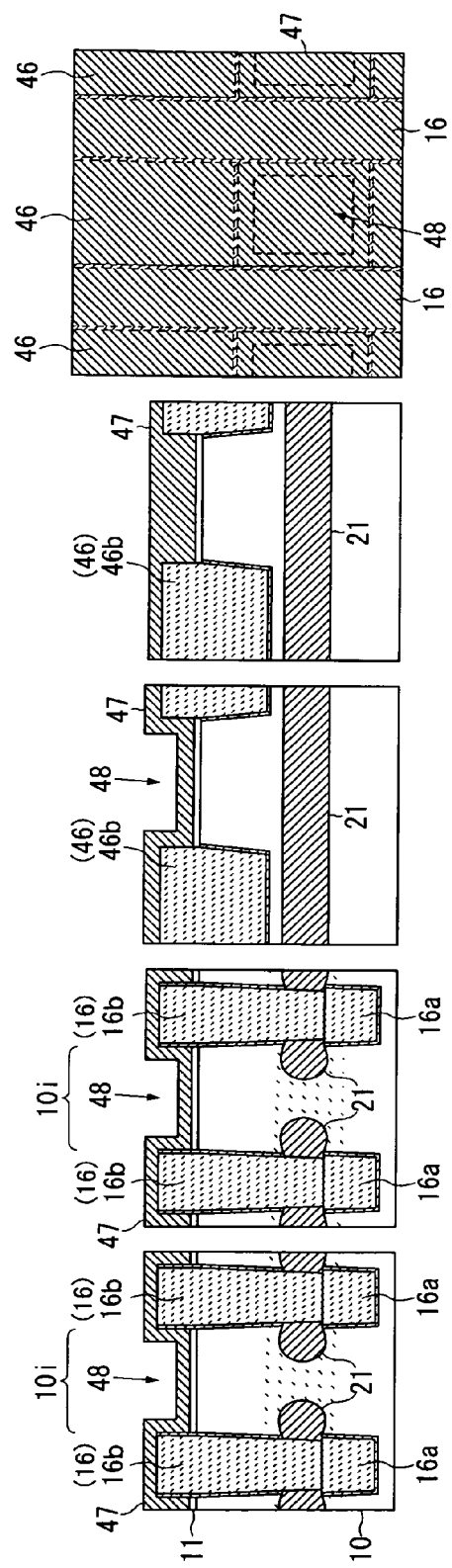

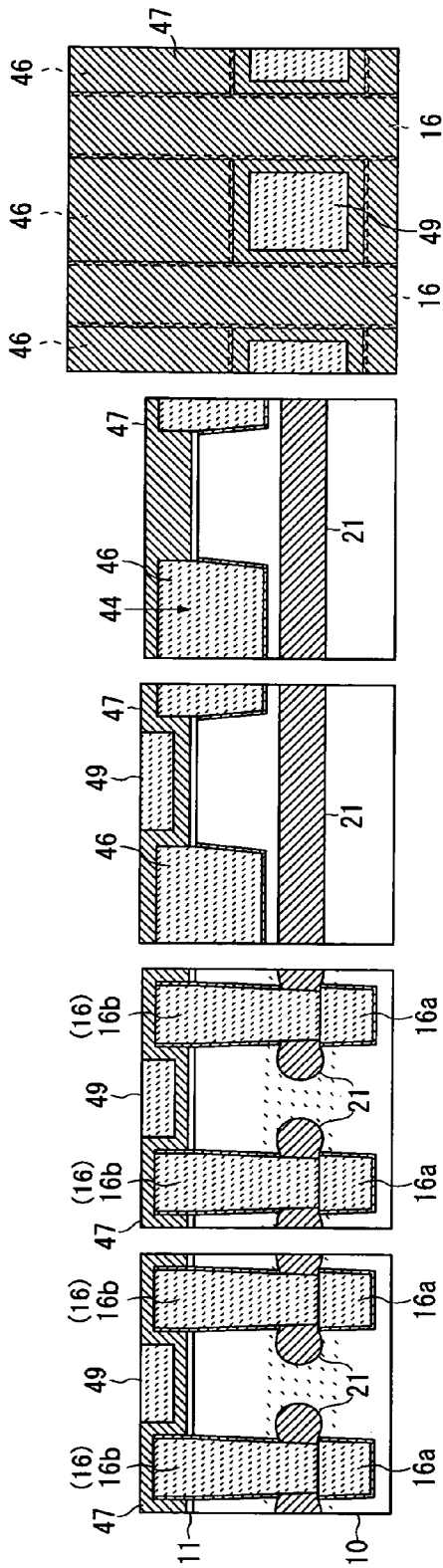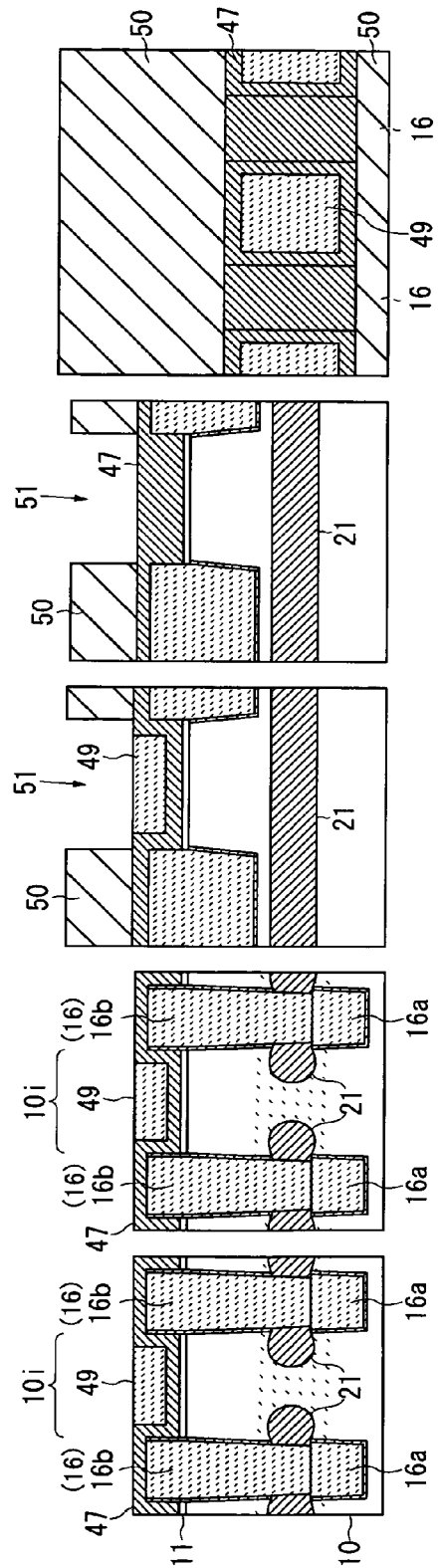

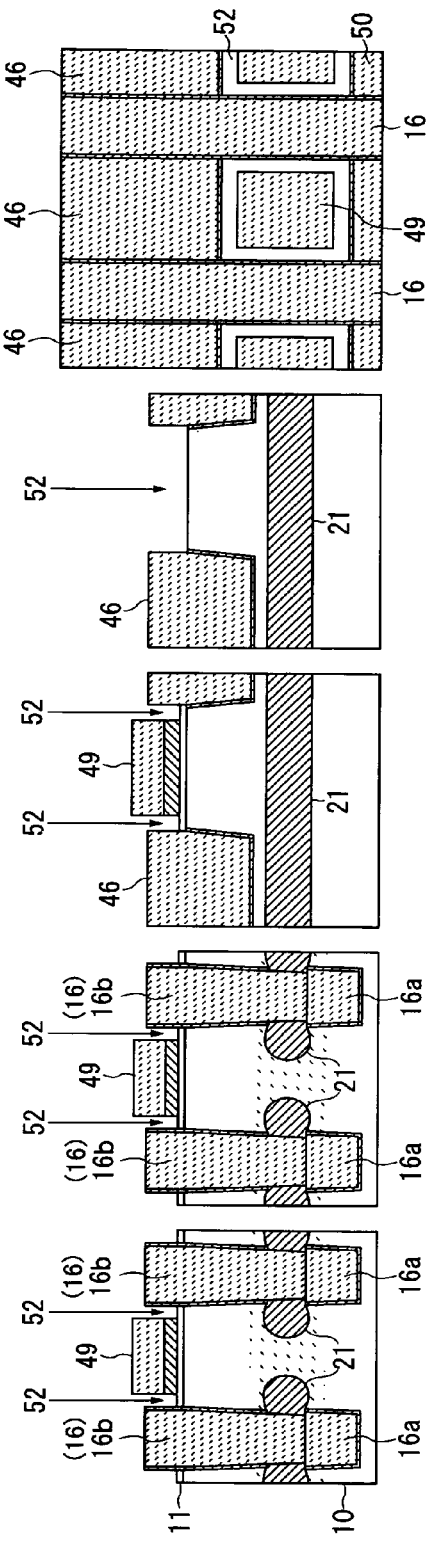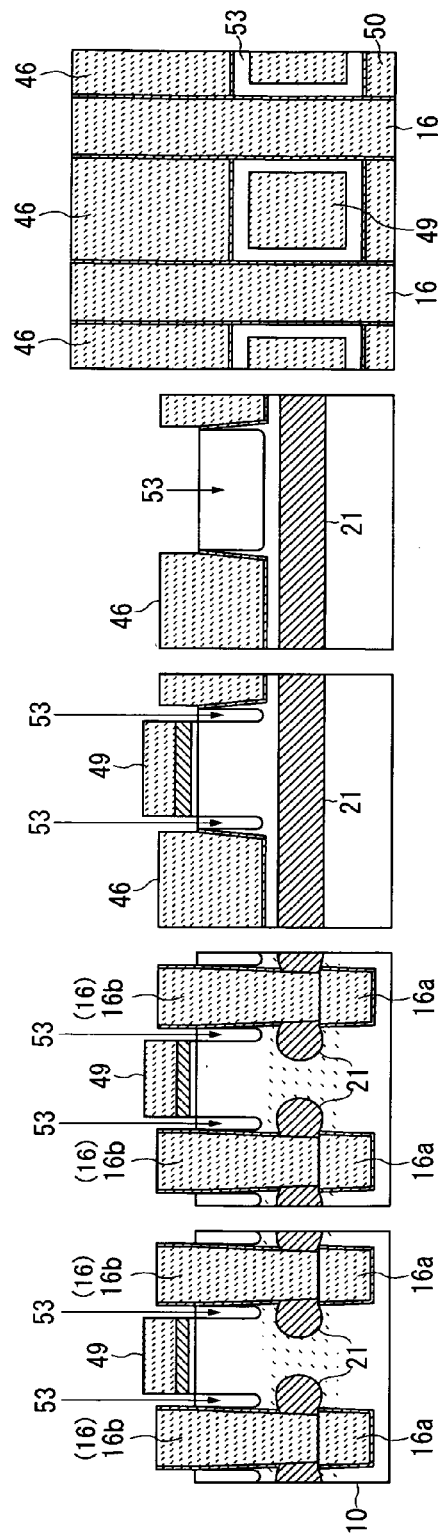

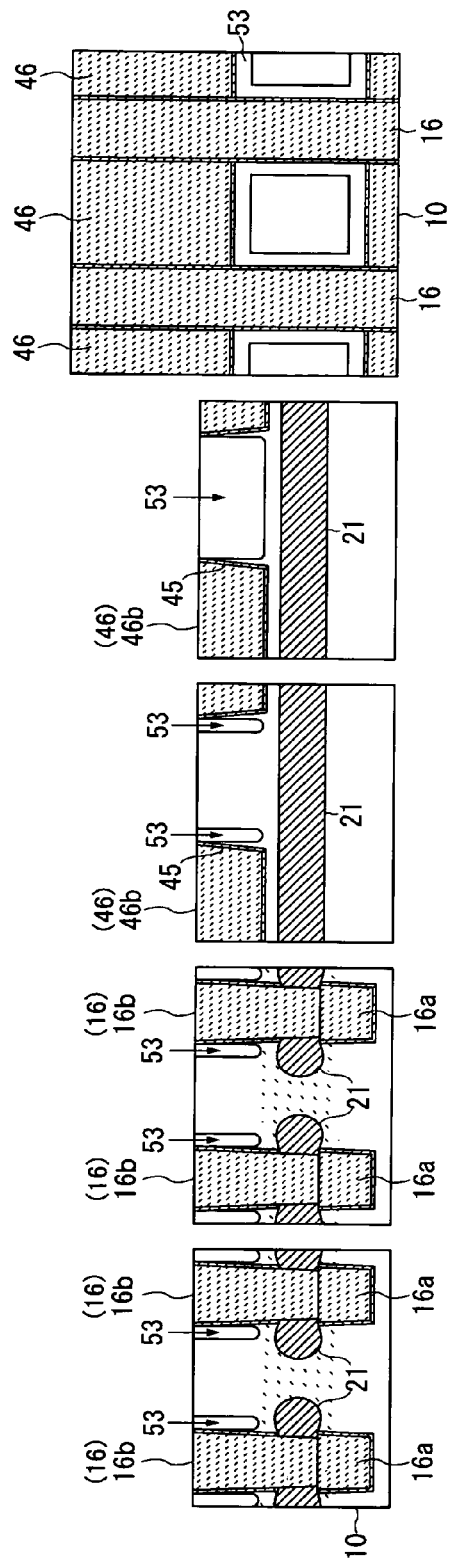
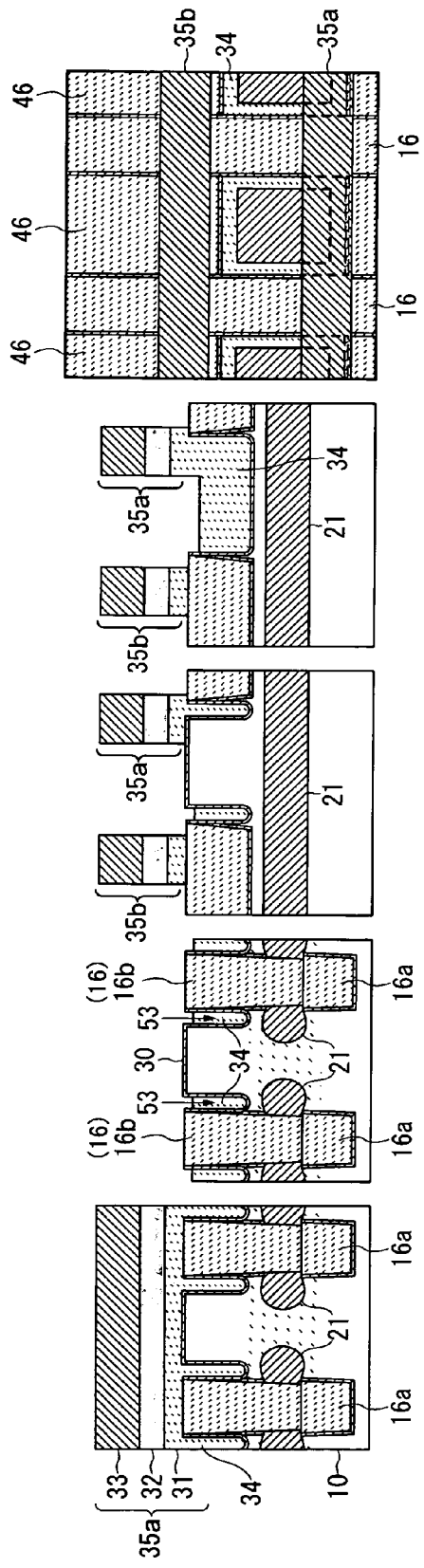

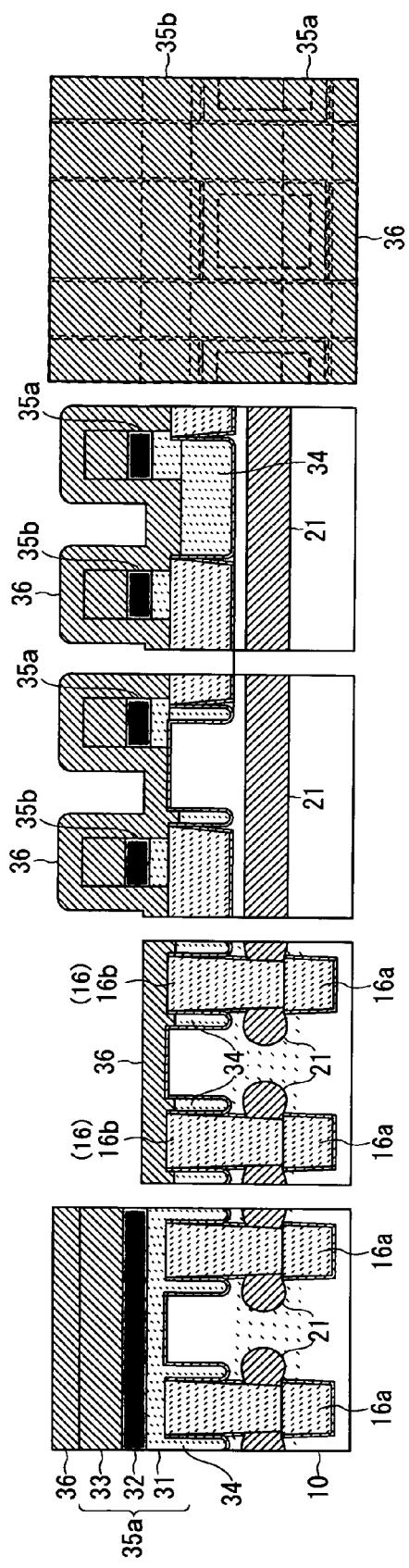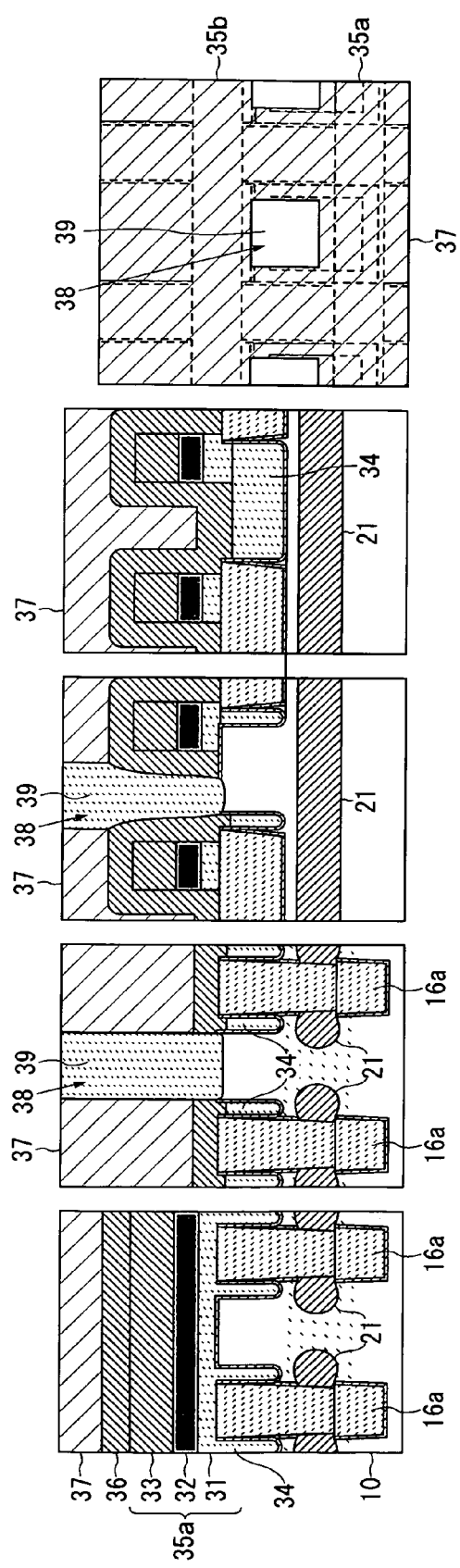

SEMICONDUCTOR DEVICE AND METHOD FOR MANUFACTURING THE SAME

BACKGROUND OF THE INVENTION

1. Field of the Invention

The present invention relates to a semiconductor device and to a method for manufacturing the same, and particularly relates to a semiconductor device comprising a vertical MOS transistor having a three-dimensional structure and a method for manufacturing the same.

2. Description of Related Art

Planar MOS transistors are generally used as MOS transistors formed on a semiconductor substrate. However, a problem with planar MOS transistors is that increased miniaturization to enhance integration results in pronounced short channel effects and increased sub-threshold current.

Methods for increasing the concentration of substrate impurities are effective as methods for controlling sub-threshold current, but increasing the concentration of impurities increases the junction leak current. An increased junction leak current is not much of a problem in transistors for logic circuits, but leads to a loss of refresh properties in cell transistors for DRAM (Dynamic Random Access Memory). It is therefore difficult to increase the concentration of impurities in cell transistors for DRAM.

Progress has been made in the research on MOS transistors having a three-dimensional structure, such as RCAT (Recess-Channel-Array Transistor) and Fin FET, as well as in applications thereof in products, as DRAM cell transistors in order to solve the problems noted above. However, as with planar MOS transistors, the source regions and drain regions of MOS transistors such as RCAT and FinFET are formed in different planes on the semiconductor substrate, giving a structure in which the on current flows along the surface of the semiconductor substrate, and it is therefore difficult to sufficiently increase integration.

By contrast, vertical MOS transistors in which the on current flows vertically have recently been proposed (see published Japanese Translation of PCT Application No. 2002-541667 and Japanese Patent Application Laid-open Nos. H5-121693 and H7-273221). Higher integration can be achieved in vertical MOS transistors because the source and drain regions are formed in substantially the same plane on the semiconductor substrate.

SUMMARY

However, a problem with vertical MOS transistors is that the device structure or manufacturing process is extremely complicated because of the need for forming gate electrodes on the sides of the vertical channel region. As a result of these problems, it is difficult to achieve further miniaturization in conventional structures.

In one embodiment, there is provided a semiconductor device that includes: a channel region extending substantially perpendicular to a main surface of a semiconductor substrate; a first diffusion layer provided on a bottom of the channel region; a second diffusion layer provided on a top of the channel region; a first gate electrode that extends substantially perpendicular to the main surface of the semiconductor substrate and that is provided on a side of the channel region through a gate insulation film; and a second gate electrode that extends substantially parallel to the main surface of the semiconductor substrate and that is connected to the top of the first gate electrode, wherein a planar position of the second gate electrode is offset relative to a planar position of the first gate electrode.

According to the present invention, the gate electrodes can be readily formed as the second diffusion layer provided on the top of the channel region is exposed because the second gate electrodes extending in the horizontal direction are disposed offset relative to the first gate electrode extending in the vertical direction.

In another embodiment, there is provided a method for manufacturing a semiconductor substrate that includes: forming a channel region extending substantially perpendicular to a main surface of a semiconductor substrate; forming a first diffusion layer on a bottom of the channel region; forming a first gate electrode extending substantially perpendicular to the main surface of the semiconductor substrate on a side of the channel region through a gate insulation film; forming a second gate electrode extending substantially parallel to the main surface of the semiconductor substrate on a top of the first gate electrode so that a planar position is offset relative to a planar position of the first gate electrode; and forming a second diffusion layer on a top of the channel region.

According to the present invention, the above vertical transistor can be manufactured by a relatively simple process.

Thus, according to the present invention, the second gate electrodes extending in the horizontal direction are disposed offset relative to the first gate electrodes extending in the vertical direction, enabling production by a relatively simple process. Further miniaturization is thus possible compared to semiconductor device comprising conventional vertical MOS transistors.

BRIEF DESCRIPTION OF THE DRAWINGS

The above features and advantages of the present invention will be more apparent from the following description of certain preferred embodiments taken in conjunction with the accompanying drawings, in which:

FIG. 6 is cross-sectional views showing one process (forming of a pad oxide film 11 and a field nitride film 12) of a manufacturing method of the semiconductor device 1 according to the first embodiment of the present invention;

FIG. 7 is cross-sectional views showing one process (patterning of the pad oxide film 11 and the field nitride film 12) of the manufacturing method of the semiconductor device 1 according to the first embodiment of the present invention;

FIG. 8 is cross-sectional views showing one process (forming of trenches 14) of the manufacturing method of the semiconductor device 1 according to the first embodiment of the present invention;

FIG. 9 is cross-sectional views showing one process (forming of a sacrificial oxidation film and a silicon oxide film 16a) of the manufacturing method of the semiconductor device 1 according to the first embodiment of the present invention;

FIG. 10 is cross-sectional views showing one process (partially removing of the sacrificial oxidation film 15 and the silicon oxide film 16a) of the manufacturing method of the semiconductor device 1 according to the first embodiment of the present invention;

FIG. 11 is cross-sectional views showing one process (forming of a SOG film 17) of the manufacturing method of the semiconductor device 1 according to the first embodiment of the present invention;

FIG. 12 is cross-sectional views showing one process (partially removing of the SOG film 17) of the manufacturing method of the semiconductor device 1 according to the first embodiment of the present invention;

FIG. 13 is cross-sectional views showing one process (forming of a silicon oxide film 18) of the manufacturing method of the semiconductor device 1 according to the first embodiment of the present invention;

FIG. 14 is cross-sectional views showing one process (removing of the SOG film 17) of the manufacturing method of the semiconductor device 1 according to the first embodiment of the present invention;

FIG. 15 is cross-sectional views showing one process (forming of cavities 20) of the manufacturing method of the semiconductor device 1 according to the first embodiment of the present invention;

FIG. 16 is cross-sectional views showing one process (forming of embedded wiring 21) of the manufacturing method of the semiconductor device 1 according to the first embodiment of the present invention;

FIG. 17 is cross-sectional views showing one process (forming of forming of a silicon oxide film 16b) of the manufacturing method of the semiconductor device 1 according to the first embodiment of the present invention;

FIG. 18 is cross-sectional views showing one process (removing of the field nitride film 12) of the manufacturing method of the semiconductor device 1 according to the first embodiment of the present invention;

FIG. 19 is cross-sectional views showing one process (forming of a silicon nitride film 23) of the manufacturing method of the semiconductor device 1 according to the first embodiment of the present invention;

FIG. 20 is cross-sectional views showing one process (filling of a silicon oxide film 25) of the manufacturing method of the semiconductor device 1 according to the first embodiment of the present invention;

FIG. 21 is cross-sectional views showing one process (forming of a photoresist 26) of the manufacturing method of the semiconductor device 1 according to the first embodiment of the present invention;

FIG. 22 is cross-sectional views showing one process (forming of slits 28) of the manufacturing method of the semiconductor device 1 according to the first embodiment of the present invention;

FIG. 23 is cross-sectional views showing one process (forming of slits 29) of the manufacturing method of the semiconductor device 1 according to the first embodiment of the present invention;

FIG. 24 is cross-sectional views showing one process (flattening of a surface of a semiconductor substrate 10) of the manufacturing method of the semiconductor device 1 according to the first embodiment of the present invention;

FIG. 25 is cross-sectional views showing one process (forming of gate insulation films 30) of the manufacturing method of the semiconductor device 1 according to the first embodiment of the present invention;

FIG. 26 is cross-sectional views showing one process (forming of first and second gate electrodes 34 and 35) of the manufacturing method of the semiconductor device 1 according to the first embodiment of the present invention;

FIG. 27 is cross-sectional views showing one process (forming of a silicon nitride film 36) of the manufacturing method of the semiconductor device 1 according to the first embodiment of the present invention;

FIG. 28 is cross-sectional views showing one process (forming of a first interlayer insulation film 37 and cell contacts 39) of the manufacturing method of the semiconductor device 1 according to the first embodiment of the present invention;

FIG. 34 is cross-sectional views showing one process (forming of trenches 44) of a manufacturing method of the semiconductor device 3 according to the second embodiment of the present invention;

FIG. 35 is cross-sectional views showing one process (forming of a sacrificial oxidation film 45 and a silicon oxide film 46b) of the manufacturing method of the semiconductor device 3 according to the second embodiment of the present invention;

FIG. 36 is cross-sectional views showing one process (removing of the field nitride film 12) of the manufacturing method of the semiconductor device 3 according to the second embodiment of the present invention;

FIG. 37 is cross-sectional views showing one process (forming of a silicon nitride film 47) of the manufacturing method of the semiconductor device 3 according to the second embodiment of the present invention;

FIG. 38 is cross-sectional views showing one process (filling of a silicon oxide film 49) of the manufacturing method of the semiconductor device 3 according to the second embodiment of the present invention;

FIG. 39 is cross-sectional views showing one process (forming of a photoresist film 50) of the manufacturing method of the semiconductor device 3 according to the second embodiment of the present invention;

FIG. 40 is cross-sectional views showing one process (forming of slits 53) of the manufacturing method of the semiconductor device 3 according to the second embodiment of the present invention;

FIG. 41 is cross-sectional views showing one process (forming of slits 54) of the manufacturing method of the semiconductor device 3 according to the second embodiment of the present invention;

FIG. 42 is cross-sectional views showing one process (flattening of a surface of a semiconductor substrate 10) of the manufacturing method of the semiconductor device 3 according to the second embodiment of the present invention;

FIG. 43 is cross-sectional views showing one process (forming of gate insulation films 30, first and second gate electrodes 34 and 35) of the manufacturing method of the semiconductor device 3 according to the second embodiment of the present invention;

FIG. 44 is cross-sectional views showing one process (forming of a silicon nitride film 36) of the manufacturing method of the semiconductor device 3 according to the second embodiment of the present invention;

FIG. 45 is cross-sectional views showing one process (completion of the semiconductor device 3) of the manufacturing method of the semiconductor device 3 according to the second embodiment of the present invention;

DETAILED DESCRIPTION OF THE EMBODIMENTS

Preferred embodiments of the present invention will be described in detail hereinafter with reference to the accompanying drawings.

Figure 1:
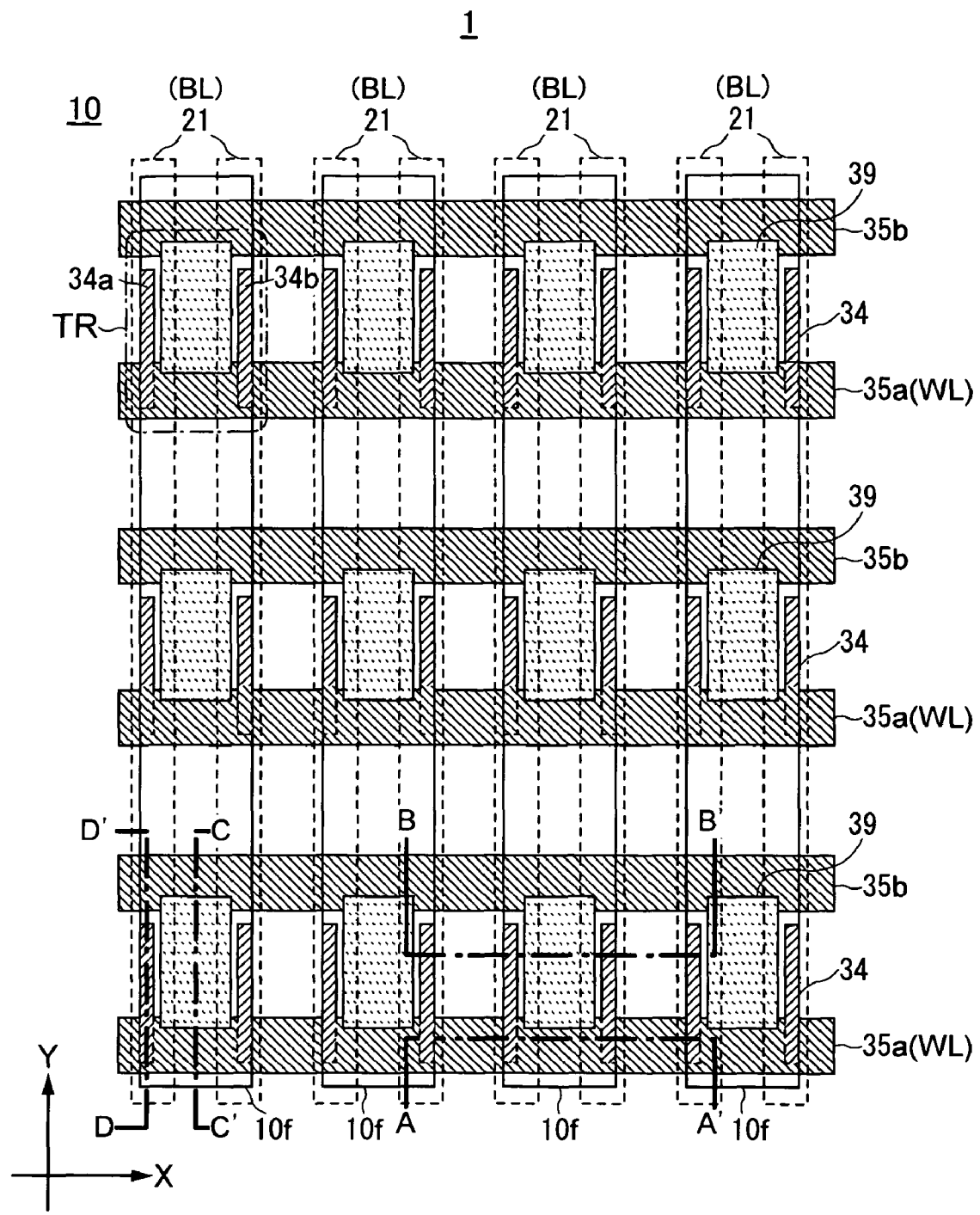
FIG. 1 is a schematic plan view showing the structure of a semiconductor device 1 according to a preferred first embodiment of the present invention.
Figures 2A, 2B, 2C, 2D:
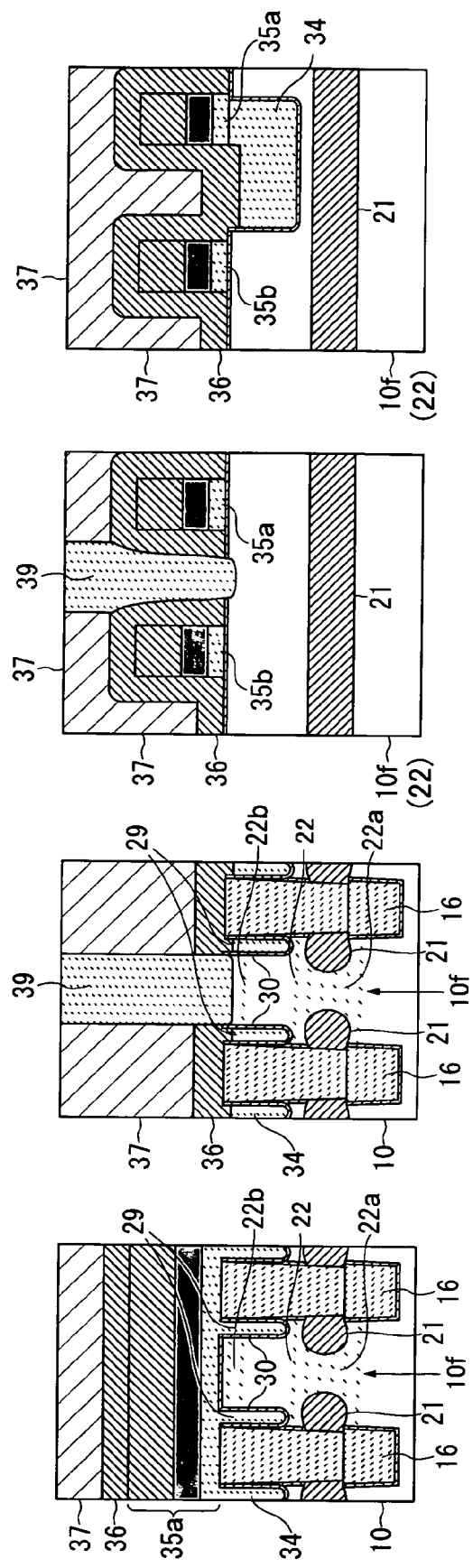
FIG. 2A is a schematic cross sectional view along line A-A' in FIG. 1.
FIG. 2B is a schematic cross sectional view along line B-B' in FIG. 1.
FIG. 2C is a schematic cross sectional view along line C-C' in FIG. 1.
FIG. 2D is a schematic cross sectional view along line D-D' in FIG. 1.
Figure 3A:
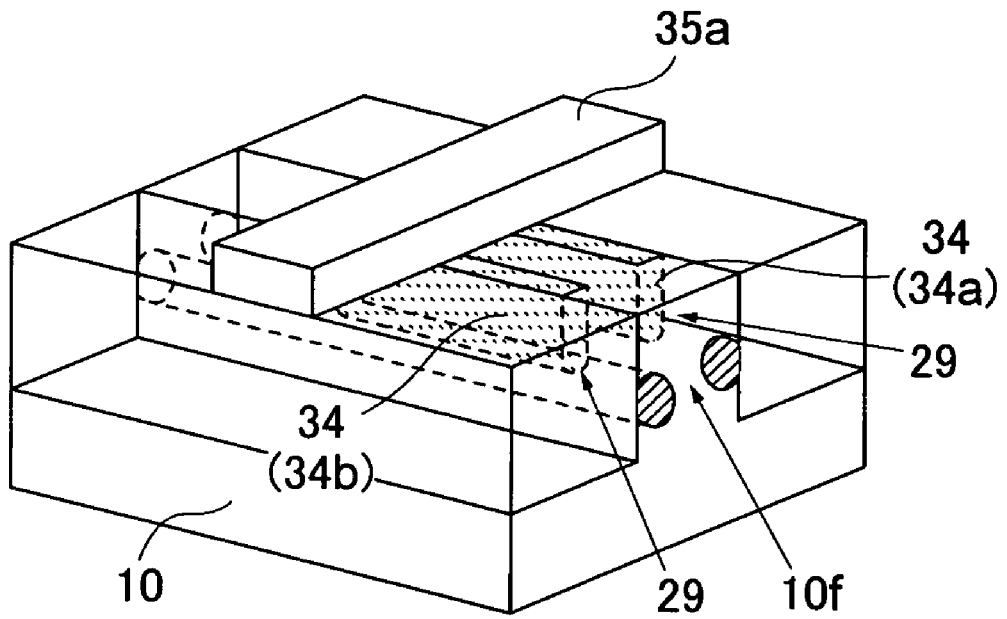
FIG. 3A is a schematic perspective view for illustrating the structure of a MOS transistor.

FIG. 1 is a schematic plan view showing the structure of a semiconductor device 1 according to a preferred first embodiment of the present invention. FIG. 2A is a schematic cross sectional view along line A-A' in FIG. 1, FIG. 2B is a schematic cross sectional view along line B-B' in FIG. 1, FIG. 2C is a schematic cross sectional view along line C-C' in FIG. 1, and FIG. 2D is a schematic cross sectional view along line D-D' in FIG. 1. FIG. 3A is a schematic perspective view for illustrating the structure of a MOS transistor, and FIG. 3B shows a situation on which the second gate electrode 35a is deleted from FIG. 3A.

Figure 3B:
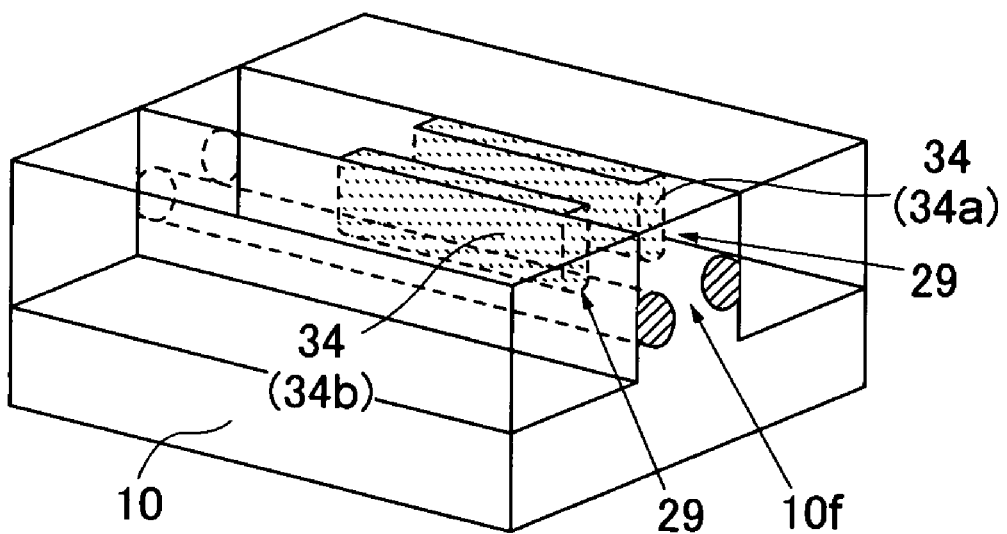
FIG. 3B shows the second gate electrode 35a deleted from FIG. 3A.

As shown in FIG. 1 and FIGS. 3A and 3B, fin-shaped active regions 10f are provided on a semiconductor substrate 10 in the semiconductor device 1 in the present embodiment. Although the details will be enumerated below, a channel region of the transistor is formed in the fin-shaped active region 10f, and the source/drain regions are formed on the top and bottom, respectively, of the fin-shaped active region 10f. That is, a vertical MOS transistor is formed, wherein the on current flows perpendicular to the main surface of the semiconductor substrate 10.

Although not particularly limited, the semiconductor device 1 in the present embodiment is preferably a DRAM cell transistor. That is because, according to the semiconductor device 1 in the present embodiment, MOS transistors can be integrated at high density, and the sub-threshold current or junction leak current can be decreased.

Figure 4:
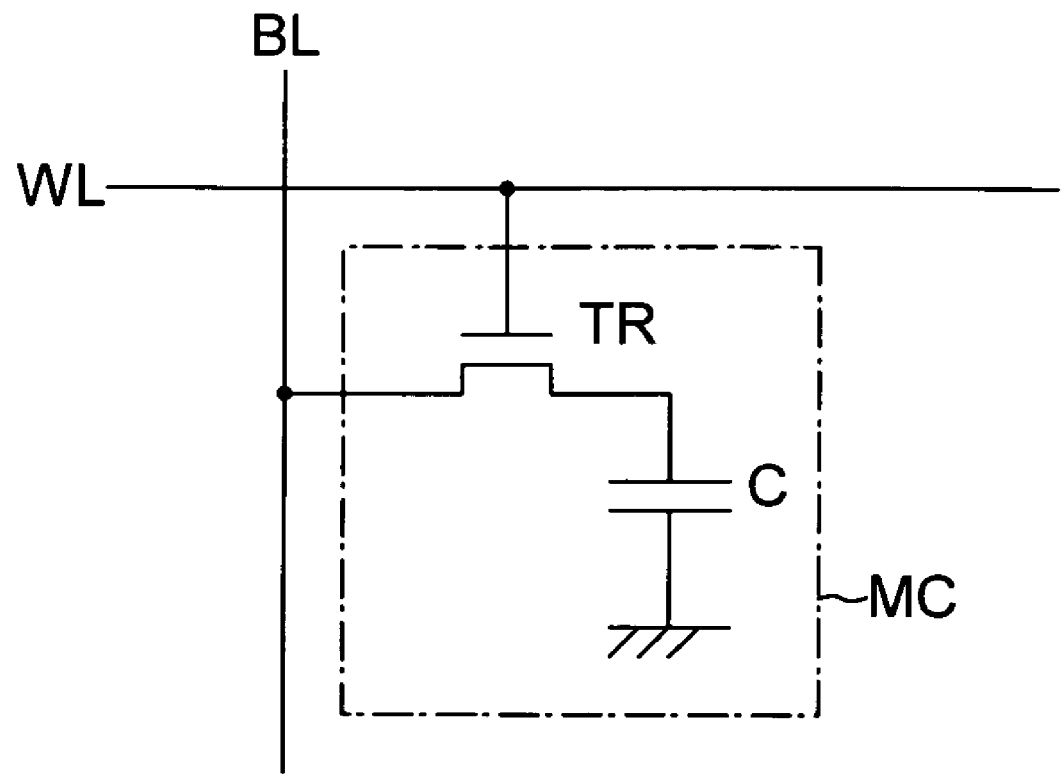
FIG. 4 is a circuit diagram showing the basic structure of a DRAM memory cell MC.

FIG. 4 is a circuit diagram showing the basic structure of a DRAM memory cell MC.

As illustrated in FIG. 4, the DRAM memory cell MC has a structure in which a cell transistor TR and a cell capacitor C are connected in series. One of either the source or drain of the cell transistor TR is connected to the cell capacitor C, and the other is connected to a bit line BL. A gate of the cell transistor TR is connected to a word line WL. According to this structure, when the word line WL is activated, the cell transistor TR is turned on, and the cell capacitor C and the bit line BL are connected. This allows data to be read and written through the bit line BL.

As shown in FIG. 1, the word lines WL are formed in the X direction, and the bit lines BL are formed in the Y direction. The cell transistors TR are then arranged at the intersections of the word lines WL and bit lines BL. The gate electrodes of the cell transistor TR are composed of first gate electrodes 34 (34a, 34b) which are vertically extending and second gate electrodes 35a which are horizontally extending. The second gate electrodes 35a form the word lines WL. In the present embodiment, dummy gate electrodes 35b are provided between adjacent second gate electrodes 35a and 35a. Reverse bias is applied to the dummy gate electrodes 35b, and cell transistors TR adjacent to each other in the direction Y are thereby electrically separated.

The structure of the cell transistor TR will be described in detail next with reference to FIGS. 1 through 3.

As illustrated in FIGS. 1 through 3, a cell transistor TR comprises a channel region 22 provided in the fin-shaped active region 10f of the semiconductor substrate 10, a first diffusion layer 22a provided on the bottom of the channel region 22, a second diffusion layer 22b provided on the top of the channel region 22, first gate electrodes 34 provided on the side of the channel region 22 via a gate insulation film 30, and second gate electrodes 35a connected to the top of the first gate electrodes 34. Insulating films 36 and 37 are formed on a top layer of the second gate electrode 35a.

The fin-shaped active region 10f extends in the direction Y, and a plurality of cell transistors TR are provided inside one active region 10f. At the locations where each cell transistor TR is formed, slits 29 formed substantially vertically relative to the main surface of the semiconductor substrate 10 are formed on both sides of the fin-shaped active region 10f, and the first gate electrodes 34 are embedded in the slits 29. Two first gate electrodes 34 are thus allocated per cell transistor TR. That is, the first gate electrodes 34 are formed by a first portion 34a covering one side of the channel region 22 and a second portion 34b covering the other side of the channel region 22 (see FIG. 3), and the channel region 22 is a structure interposed between the first and second portions 34a and 34b. Here, the sides of the channel region 22 indicate surfaces substantially orthogonal to the direction in which the second gate electrodes 35a extend.

The second gate electrodes 35a are arranged planarly offset relative to the first gate electrodes 34. The region interposed between the first gate electrodes 34 is therefore composed of a portion covered by a second gate electrode 35a and a portion not covered by a second gate electrode 35a, and the upper surface of the portion not covered by the second gate electrodes 35a is exposed. A cell contact 39, which is a top electrode, is connected to the exposed region, whereby the cell contact 39 is connected to the second diffusion layer 22b.

The second gate electrodes 35a are of a sufficient length in the direction X, being substantially linear wiring shared by a plurality of cell transistors. By contrast, the length of the first gate electrodes 34 in the direction Y is relatively short. This is because the second gate electrodes 35a form word lines WL, whereas the first gate electrodes 34 are the gate electrodes of individual cell transistors TR. The first gate electrodes 34 are preferably as long as possible in the direction Y, provided that the second gate electrodes 35a and dummy gate electrodes 35b are not shorted.

Two embedded wires 21 which are bottom electrodes are provided at the bottom of the fin-shaped active region 10f. The embedded wires 21 form bit lines BL and extend in the direction Y intersecting with the second gate electrodes 35a to connect to the first diffusion layer 22a. In the present embodiment, two bit lines BL are allocated per cell transistor TR for manufacturing reasons.

Described in the foregoing is the basic structure of the semiconductor device 1 according to the present embodiment. Because the horizontally extending second gate electrodes 35a are thus arranged planarly offset relative to the vertically extending first gate electrodes 34, the top of the channel region can be exposed while ensuring contact between the first gate electrodes 34 and second gate electrodes 35a. A gate electrode of a vertical MOS transistor can thus be easily formed.

Figure 5:
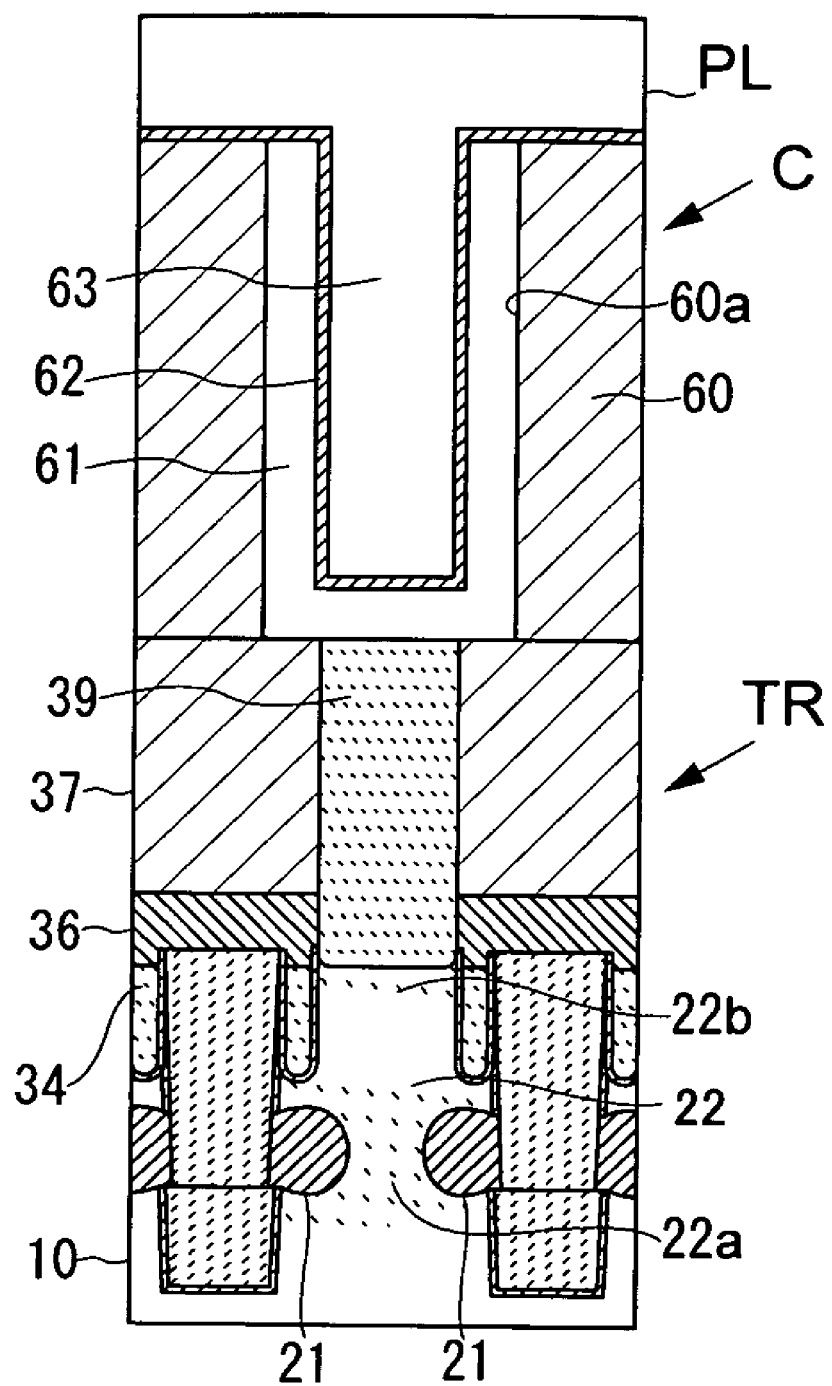
FIG. 5 is a schematic cross sectional view showing the structure of a DRAM memory cell utilizing the above cell transistor TR.

FIG. 5 is a schematic cross sectional view showing the structure of a DRAM memory cell utilizing the above cell transistor TR.

As shown in FIG. 5, a cell capacitor C is provided above the cell transistor TR. The cell capacitor C is composed of a cylinder type of bottom electrode 61 connected to the second diffusion layer 22b via a cell contact 39, a column type top electrode 63 connected to plate wiring PL, and a capacitance insulation film 62 provided between the bottom electrode 61 and top electrode 63. The cell capacitor C is provided inside a cavity 60a passing through an interlayer insulation film 60.

The semiconductor device 1 having the above structure can write and read data by the activation of any one of the plurality of word lines WL using a word driver (not shown). That is, because the cell transistor TR is on in a memory cell MC in which the corresponding word line WL has been activated, the corresponding bit line BL will become connected to the cell capacitor C via the cell transistors TR. Accordingly, after the cell capacitor C and the bit line BL are connected, the potential difference showing up in the bit line BL can be amplified by a sense amp (not shown) to allow the data held in the cell capacitor C to be read. While the cell capacitor C and the bit line BL are connected, the bit line BL can be driven by the sense amp to allow the data to be written to the cell capacitor C.

A manufacturing method of the semiconductor device 1 according to the present embodiment will be described below.

FIGS. 6 through 28 are diagrams of steps for illustrating the manufacturing method of the semiconductor device 1 according to the first embodiment of the invention, where A of each is a schematic cross sectional view along line A-A' in FIG. 1, B is a schematic cross sectional view along line B-B' in FIG. 1, C is a schematic cross sectional view along line C-C' in FIG. 1, D is a schematic cross sectional view along line D-D' in FIG. 1, and E is a schematic plan view.

In the manufacturing of the semiconductor device 1 according to the present embodiment, a silicon oxide film (pad oxide film) 11 and a silicon nitride film (field nitride film) 12 are formed, in the stated order, on a semiconductor substrate (silicon wafer) 10 as shown in FIG. 6. The field nitride film 12 serves as a mask covering the diffusion layer, and is also used as a CMP stopper when polishing the silicon oxide film embedded in the element isolation region (STI: Shallow Trench Isolation).

Then, as illustrated in FIG. 7, the field nitride film 12 and pad oxide film 11 are patterned is preformed by photolithography and dry etching (anisotropic etching). As a result, portions of the field nitride film 12 and pad oxide film 11 are removed. At this time, opening patterns 13 with band-shaped extending in the direction Y will be formed.

Then, as illustrated in FIG. 8, the semiconductor substrate 10 is dry etched using the field nitride film 12 as a mask to form trenches 14 for element isolation region to a depth of about 400 nm. Here, the trenches 14 are formed linearly along the direction Y, and the region interposed between two adjacent trenches 14 and 14 will be the fin-shaped active region 10f.

Then, as illustrated in FIG. 9, an approximately 5 nm thick silicon oxide film (sacrificial oxidation film) 15 is formed on the inner walls of the trenches 14 by thermal oxidation. An approximately 150 nm thick silicon oxide film 16a is then formed on the entire surface of the substrate, including the interior of the trenches 14, by HDP-CVD (High Density Plasma Chemical Vapor Deposition). Because, at this time, the silicon oxide film 16a will tend to be deposited in the horizontal plane and will be less likely to be deposited in the vertical plane owing to the properties of HDP-CVD, the film will be thickly formed on the upper surface of the field nitride film 12 and the bottom of the trenches 14 and thinly formed on the sides of the trenches 14 as illustrated.

The silicon oxide film 16a on the field nitride film 12 is then removed by CMP (Chemical Mechanical Polishing) using the field nitride film 12 as a stopper. Rapid wet etching is then furthermore performed using a solution containing hydrofluoric acid, and the sacrificial oxide film 15 exposed on the sides of the trenches 14 and the sides of the openings in the field nitride film 12 is removed. Even though the silicon oxide film 16a at the bottom of the trenches 14 is etched thinner at this time, an approximately 100 nm thick silicon oxide film 16a remains on the bottom of the trenches 14, as shown in FIG. 10.

Then, as shown in FIG. 11, an approximately 400 nm thick SOG (Spin On Grass) film 17 is formed on the entire surface of the substrate. Then, in order to modify the SOG film 17, an approximately 10 minute heat treatment (baking treatment) is performed at 400° C., for example, giving the modified SOG film 17. Here, because the SOG film 17 will be removed by subsequent wet etching, the heat treatment at this time is preferably performed under conditions allowing the SOG film 17 to be etched more rapidly than the etching of the TEOS (Tetra Ethyl Ortho Silicate)-NSG (Non-doped Silicate Glass) film or silicon oxide film formed by HDP-CVD in subsequent etching. The SOG film 17 is then partially removed by wet etching. An SOG film 17 having a thickness of about 100 nm is thus left on the silicon oxide film 16a formed at the bottom of the trenches 14, as shown in FIG. 12.

An approximately 15 nm thick silicon oxide film (TEOS-NSG film) 18 is furthermore formed on the entire surface of the substrate. The silicon oxide film 18 on the SOG film 17 and field nitride film 12 is then removed by anisotropic dry etching. This results in the formation of a silicon oxide film 18 only on the exposed surfaces of the inner walls in the trenches 14, as illustrated in FIG. 13.

The SOG film 17 is then removed by wet etching, as shown in FIG. 14. As noted above, the SOG film 17 etching rate is more rapid than that of the other silicon oxide films, thus allowing the SOG film 17 to be selectively removed. The side wall regions of the trenches 14 where the SOG film 17 has thus been removed are exposed surfaces 19 on the semiconductor substrate 10.

Then, as shown in FIG. 15, cavities 20 are formed on both sides of the diffusion layer. The cavities 20 are formed by dry etching with chlorine gas using the field nitride film 12, silicon oxide film 16a, and silicon oxide film 18 as masks. The exposed surface 19 of the semiconductor substrate 10 is thus isotropically etched, and both sides of the semiconductor substrate 10 serving as the fin-shaped active region 10f are rounded off. The approximately 50 nm deep (diameter) cavities 20 thus formed serve as embedded wiring regions. Because the semiconductor substrate 10 is etched from both sides of the side walls of the trenches 14 at this time, caution is required to avoid having adjacent cavities 20, 20 penetrate through to each other and cause pattern failure.

Then, as illustrated in FIG. 16, embedded wiring 21 is formed in the cavities 20. To form the embedded wiring 21, pre-treatment is performed using a solution containing hydrofluoric acid to remove naturally oxidized film in the cavities 20, and a polysilicon film including a large amount of phosphorus (P) or arsenic (As) is formed to about 200 nm (not shown) over the entire surface of the substrate, including the interior of the trenches 14. The concentration of impurities in the polysilicon film at this time is preferably $1.0 \times 10^{20}$ to $4.5 \times 10^{20}$ cm$^{-3}$. The polysilicon film is then isotropically etched at a selection ratio relative to the field nitride film 12 and silicon oxide film 18 so that the polysilicon film is left only in the cavities 20 and no polysilicon film is left over on the sides of the silicon oxide film 18 and field nitride film 12.

The polysilicon film embedded in the cavities 20 has the same role as what is referred to as a bit line conductive film in DRAM. A subsequently added heat treatment will result in the diffusion of phosphorus (P) or arsenic (As) impurities from the polysilicon film, and further subsequent implantation of impurities will result in the formation of lower source/drain region (first diffusion layer 22a) in the vertical transistors.

The material for the embedded wiring 21 is not limited to polysilicon film. For example, a silicide film such as tungsten silicide (WSi$_2$) or cobalt silicide (CoSi$_2$) or a refractory metal such as tungsten (W) may be used to lower the resistance of the embedded wiring 21. However, when a refractory metal is used, it will be necessary to use a barrier metal such as titanium nitride (TiN), tungsten nitride (WN$_2$), or tantalum nitride (TaN) to prevent the metal from diffusing. Further, when the above silicide films or refractory metals are used, the implantation of impurities such as phosphorus (P) and arsenic (As) will be required in order to form the drain and source under the vertical transistor.

An approximately 500 nm thick silicon oxide film 16b is then formed by HDP-CVD, and the silicon oxide film 16b is embedded in the trenches 14. The silicon oxide film 16b on the field nitride film 12 is furthermore removed and flattened by CMP using the field nitride film 12 as a stopper. As shown in FIG. 17, this will finish the embedded wiring 21 and element isolation regions 16 comprising the silicon oxide films 16a and 16b.

However, it will not be possible to form the active regions of the peripheral circuit region in DRAM by the above process alone. When the active regions of the peripheral circuit regions are formed, element isolation region trenches of about 250 nm may be formed by photolithography and dry etching in the above state, an approximately 10 nm silicon oxide film may be formed by thermal oxidation on the inner walls of the trenches, and the silicon oxide film may then be embedded by HDP-CVD and flattened by CMP to produce active regions for forming transistors in peripheral circuit regions.

Then, as shown in FIG. 18, so as to ensure a difference in height of about 50 nm between the top surface of the silicon oxide film 16b forming the element isolation region 16 and the upper surface of the semiconductor substrate 10, the silicon oxide film 16b is wet etched and then wet etched using approximately 160° C. hot phosphoric acid, and the field nitride film 12 used as a CMP stopper is removed. The pad oxide film 11 is not removed at this time.

Then, as shown in FIG. 19, a silicon nitride film 23 is formed on the entire surface of the substrate. The silicon nitride film 23 will serve as a mask during the formation of the slits described below. It will be necessary to set the thickness of the silicon nitride film 23 to no more than half the width of the active region 10f. This may be set to about 25 nm, for example. Thus setting the silicon nitride film 23 to a suitable thickness will result in the formation of concave portions 24 with the silicon nitride film 23 between element isolation regions 16 and 16.

Then, as shown in FIG. 20, an approximately 100 nm thick silicon oxide film 25 is formed over the entire surface of the substrate, and CMP is then performed using the silicon oxide film 23 as a stopper. As a result, the silicon oxide film 25 will be embedded in the concave portions 24 of the silicon nitride film 23.

Then, as shown in FIG. 21, a patterned photoresist 26 is formed by photolithography in such a way as to have openings 27 in regions used as channels and regions in which gate electrodes are to be formed.

Then, as shown in FIG. 22, the silicon nitride film 23 is removed by dry etching using the photoresist 26 as a mask. This will result in the removal of portions of the silicon nitride film 23 formed on the element isolation regions 16 as well as in the exposure of the silicon oxide film 16b along with the silicon oxide film 25. Portions of the silicon nitride film 23 formed in the step part are removed from among the silicon nitride film 23 formed on the semiconductor substrate 10, resulting in the formation of slits 28 corresponding to the thickness of the silicon nitride film 23. The pad oxide film 11 will be exposed at the bottom of the slits 28. The photoresist 26 left over after the silicon nitride film 23 has been etched is removed by dry etching.

Then, as shown in FIG. 23, the semiconductor substrate 10 is anisotropically dry etched using the silicon oxide film 16b and silicon oxide film 25 as masks, and approximately 125 nm deep slits 29 are formed in the active regions 10f on the semiconductor substrate 10. Prior to the etching, it will be necessary to etch the silicon oxide films and to remove the pad oxide film 11 exposed on the surface in order to expose the semiconductor substrate 10.

The silicon oxide film 16b and silicon oxide film 25 are then removed by wet etching using a solution containing hydrofluoric acid, and an approximately 5 nm thick silicon oxide film (sacrificial oxide film) is then formed (not shown) by thermal oxidation in the slits 29. The silicon nitride film 23 is then removed by wet etching using approximately 160° C. hot phosphoric acid. While the pad oxide film 11 remains, the semiconductor substrate 10 is furthermore thermally oxidized to thicken the pad oxide film 11, and a through oxide film for impurity implantation is formed. Impurities are then implanted to form channels and to form wells for transistors in memory cell regions and peripheral circuit regions, and heat treatment is performed for activation. After the implantation of impurities, the above through oxide film (pad oxide film 11) and silicon oxide film (sacrificial oxide film) formed in the slits 29 are again removed using a solution that includes hydrofluoric acid. As a result, the main surface of the semiconductor substrate 10 will become substantially flat, as shown in FIG. 24.

Then, as shown in FIG. 25, gate insulation films 30 consisting of approximately 6 to 7 nm thick silicon oxide films are formed by thermal oxidation.

Then, as shown in FIG. 26, first and second gate electrodes 34 and 35a and dummy gate electrodes 35b are formed. The gate electrodes 34, 35a, and 35b are formed by first forming an approximately 80 nm thick polysilicon film 31 by CVD on the entire surface of the substrate. The polysilicon film 31 may contain an abundance of phosphorus (P) and may contain an abundance of boron B. When a polysilicon film containing an abundance of boron B is used, it will be necessary to nitride the gate insulation film 30 and add nitrogen. More specifically, a polysilicon film 31 that contains about $2.2 \times 10^{20}$ cm$^{-3}$ phosphorus (P) as an impurity can be used. At this time, the polysilicon film 31 is embedded in slits 29 that have been formed by cavitating the diffusion layer, and those portions serve as first gate electrodes 34.

After the formation of the polysilicon film 31, boron is implanted for the channel regions of memory cell transistors. The implantation conditions are about 50 keV/$4.0\times10^{12}$ $cm^{-2}$.

A multilayered conductive film 32 in which a tungsten silicide (WSi) film, tungsten nitride (WN) film, and tungsten (W) film are laminated is then sequentially formed. Although not particularly limited, the WSi film can be 5 nm, the WN film can be about 10 nm, and the W film can be about 55 nm. A hard mask silicon nitride film 33 and silicon oxide film (not shown) are then formed in sequence. Although not particularly limited, the silicon nitride film 33 can be about 140 nm, and the silicon oxide film can be about 80 nm.

The gate electrodes 34 are then patterned by photolithography and dry etching. While the WN film and W film are etched, the approximately 80 nm silicon oxide film will end up not being completed and portions of the silicon nitride film 33 will end up not being about 40 nm. Also, as illustrated, when the polysilicon film 31 is etched, the polysilicon film 31 embedded in the slits 29 will be etched about 30 nm and deeply excavated in an over-etching step. Although the details will be elaborated below, portions of the sidewalls consisting of the silicon nitride film are embedded in the excavated portions to allow short defects to be prevented during the formation of upper contacts. Based on the above, the first and second gate electrodes 34 and 35a and the dummy gate electrodes 35b are completed.

After the formation of the first and second gate electrodes 34, 35a and the dummy gate electrodes 35b, heat oxidation is performed, and the exposed surface of the polysilicon film 31 and the semiconductor substrate 10 are oxidized about several nm (not shown). An LDD (Lightly Doped Drain) region of peripheral transistor (not shown) is then formed by ion implantation, and an approximately 5 nm thick silicon oxide film (not shown) and an approximately 20 nm thick silicon nitride film 36 are then formed in sequence, as shown in FIG. 27. At this time, the width of the slits 29 is about 30 nm, which is about two times narrower than the film level of the silicon nitride film 36. The silicon nitride film 36 is therefore embedded in the slits 29, and the portions where the polysilicon film 31 has been over-etched are completely covered by the silicon nitride film 36 in the slits 29 when the film formation is complete.

Furthermore, although not shown, an approximately 55 nm thick TEOS-NSG film is formed by CVD over the entire surface of the substrate. Openings are then formed by photolithography and dry etching in the resist only in the peripheral transistor regions, the TEOS-NSG film is then anisotropically etched, and sidewalls for the peripheral transistors are formed. Photolithography is then used to furthermore remove the TEOS-NSG film left over the memory cell region by a wet treatment while the resist has openings only in the cells. After the removal of the above resist having openings on only the memory cell region, a silicon nitride film is formed to about 13 nm on the entire surface substrate so as to increase the SAC (self align contact) margin during cell contact hole formation and form the film on the transistor TEOS-NSG film in the peripheral circuit region.

Then, as shown in FIG. 28, a first interlayer insulation film 37 is formed. Specifically, an approximately 600 nm to 700 nm BPSG (Boronic Phosphoric Silicate Glass) film is formed, and the BPSG film is then embedded between the gate electrodes and the BPSG film surface is flattened by reflow at about 800° C. and CMP. An approximately 200 nm thick TEOS-NSG film is then formed on the BPSG film to form the first interlayer insulation film 37 consisting of the BPSG oxide film and TEOS-NSG film.

In addition, as shown in FIG. 28, contact holes 38 are formed through the first interlay insulation film 37 by photolithography and dry etching. In the formation of the contact holes 38, etching is performed until the contact hole 28 reaches the semiconductor substrate 10, and the surface of the semiconductor substrate 10 is further removed about 10 nm to lower contact resistance. This etching involves the use of SAC (Self Align Contact) utilizing differences in the etching rates of the silicon oxide film and silicon nitride film. Because the silicon nitride film 36 is embedded at the top of the slits 29, forming the contact holes 38 will not cause shorts with the gate electrodes.

After the formation of the contact holes 38, phosphorus (P) or arsenic is implanted into the substrate surface to form the source/drain region (second diffusion layer 22b) above the vertical transistors. For example, the impurity implant level is about 15 keV/$5.0\times10^{12}$ $cm^{-3}$ of phosphorus (P). However, impurities do not need to be added.

The phosphorus (P)-doped polysilicon film is then used to fill the contact holes 38 and is deposited on the first interlayer insulation film 37. Only the polysilicon film on the first interlayer insulation film 37 is removed by dry etching and CMP so as to form cell contacts 39 as shown in FIG. 28. Although not particularly limited, the impurity concentration in the polysilicon film can be $1.0\times10^{20}$ to $4.5\times10^{20}$ $cm^{-3}$. In addition, after the formation of the cell contacts 39, an approximately 200 nm plasma oxide film is formed (not shown), and a heat treatment is performed to activate the impurities in the cell contacts 39.

Figure 29:
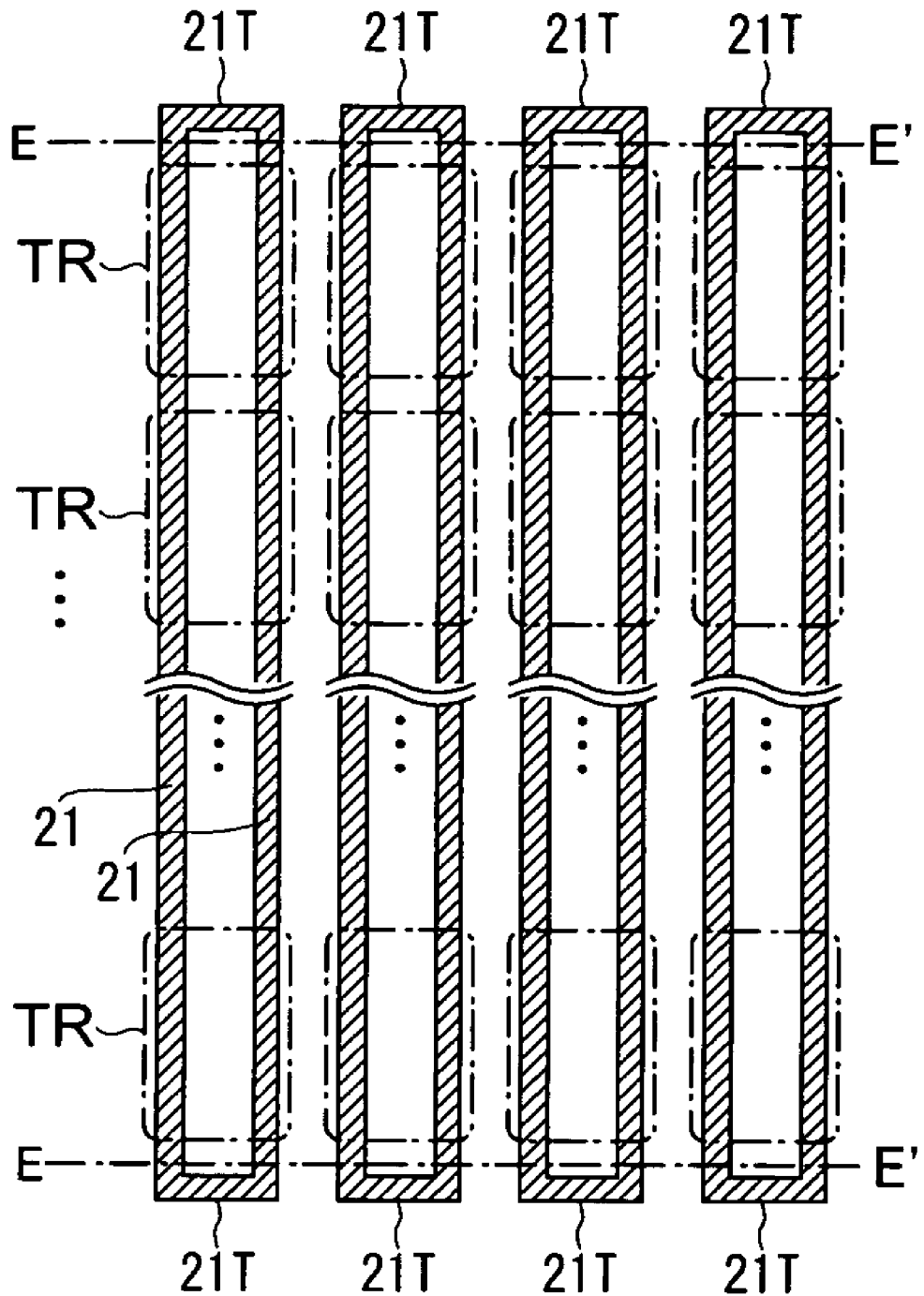
FIG. 29 is a plan view showing the structure of embedded wires (embedded bit lines) 21.

Contacts for obtaining information for the embedded bit lines are then formed. As shown in FIG. 29, the embedded wiring 21 is sufficiently long, but because the ends of a pair of embedded wires 21 and 21 are short circuited, it is necessary to cut short circuit portions 21T along line E-E' and form separate wiring.

The semiconductor device 1 having cell array transistors with a fin structure is thereby completed. When the semiconductor device 1 in the present embodiment is formed as a DRAM memory cell array, conventional methods will be used to form peripheral transistor contacts, and bit lines, capacitors C, and wiring (Al, Cu), etc. giving potential to all transistors or sites. A DRAM memory cell such as the one shown in FIG. 5 is thus completed. The capacitor C may also be directly formed on the cell contact 39, and may also be formed on another contact plug (such as capacitance contact plugs passing between bit lines) once it has been formed.

Figure 30:
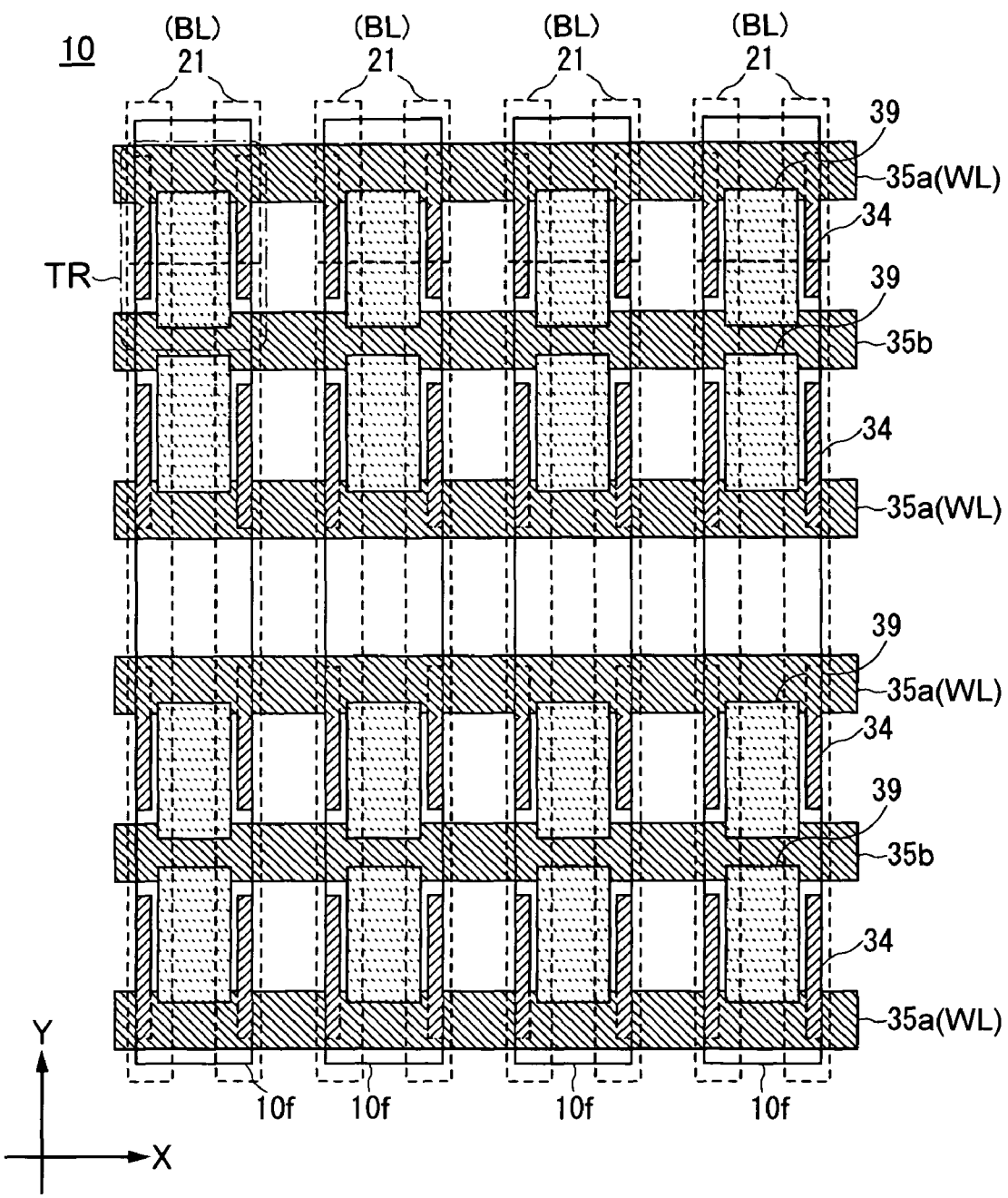
FIG. 30 is a plan view showing the structure of a semiconductor device 2 in a variant of the semiconductor device 1.

FIG. 30 is a plan view showing the structure of a semiconductor device 2 in a variant of the semiconductor device 1.

As shown in FIG. 30, in the semiconductor device 2 in the present embodiment, the second gate electrodes 35a and dummy gate electrodes 35b are not alternatingly arranged. A dummy gate electrode 35b is interposed between two second gate electrodes 35a and 35a, and the cell transistors TR have a symmetrical lay out centered on the dummy gate electrode 35b. The region (center portion in FIG. 30) where no dummy electrodes 35b are interposed between two second gate electrodes 35a and 35a functions an element isolation region because there is no implantation for channels or implantation for sources and drains and no contact holes are located there. To ensure element isolation, impurities such as indium (In) and antimony (Sb) may be implanted in this region after the gate electrodes have been formed. In the semiconductor device 1 in the first embodiment, as shown in FIG. 1, $8F^2$ cells in a symmetrical layout were used, but in the semiconductor device 2 of the variant, the cells can be changed to 6F² cells to bring about further miniaturization.

A second embodiment of the invention is described in detail below.

In the structure proposed in the first embodiment above, first gate electrodes 34 were arranged in two planes on both sides of the channel region in a circuit combining embedded wiring and vertical transistors. However, it is expected that further miniaturization will result in a decreases in transistor on current due to a decrease in channel area. Thus, in the second embodiment, a vertical transistor structure in which the entire periphery of the channel region is surrounded by first gate electrodes 34 is proposed as an on current countermeasure.

Figure 31:
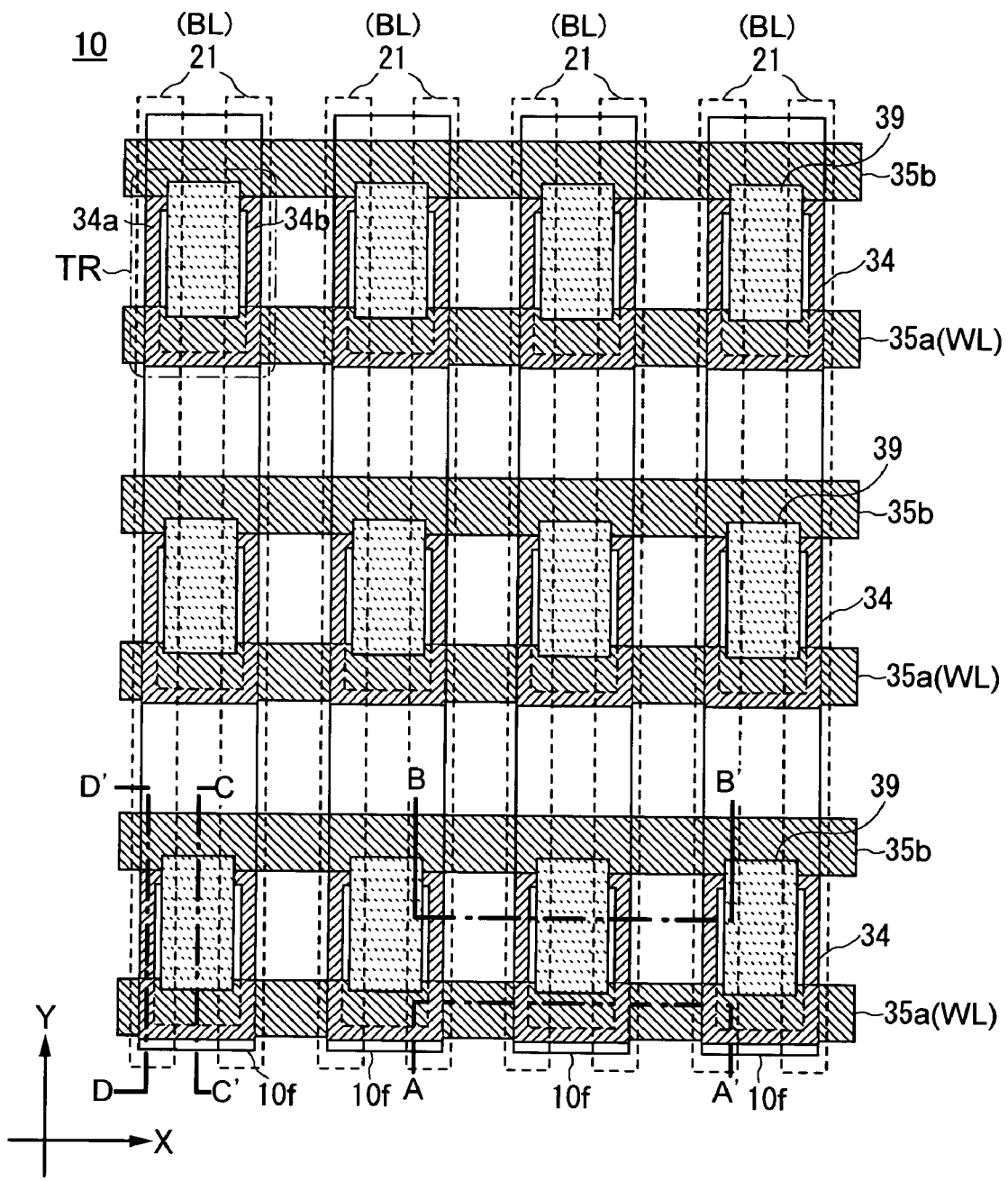
FIG. 31 is a schematic plan view showing a structure of a semiconductor device 3 according to a preferred second embodiment of the present invention.
Figure 32:
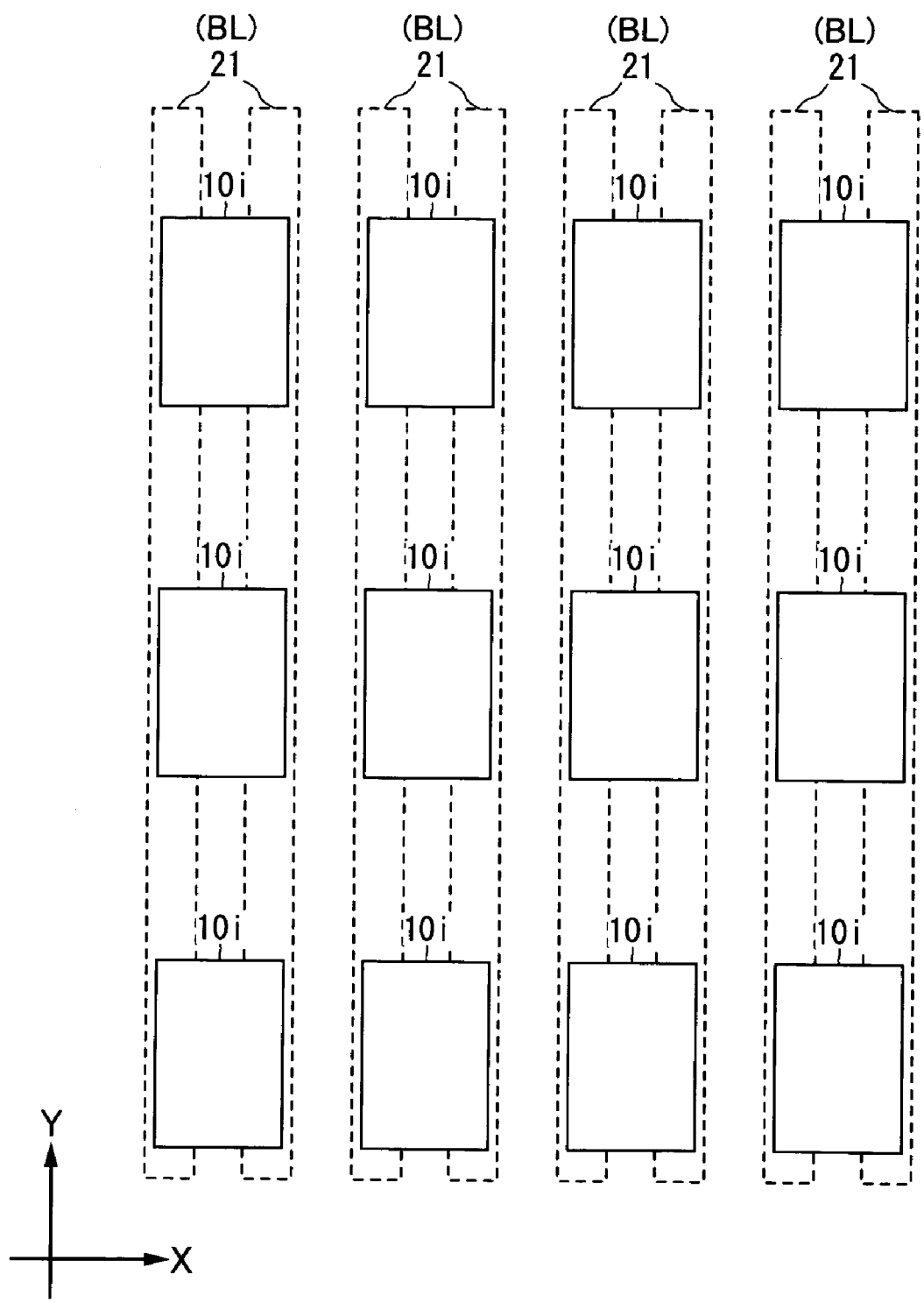
FIG. 32 is a schematic plan view showing a layout of an active region 10i in FIG. 31.
Figure 33A:
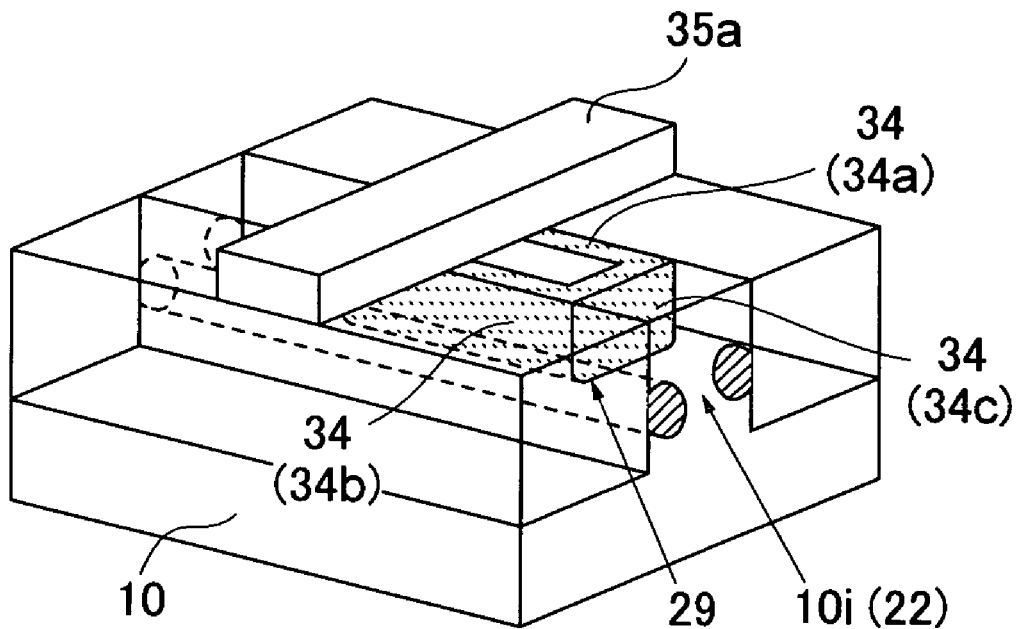
FIG. 33A is a schematic perspective view for illustrating the structure of a MOS transistor.
Figure 33B:
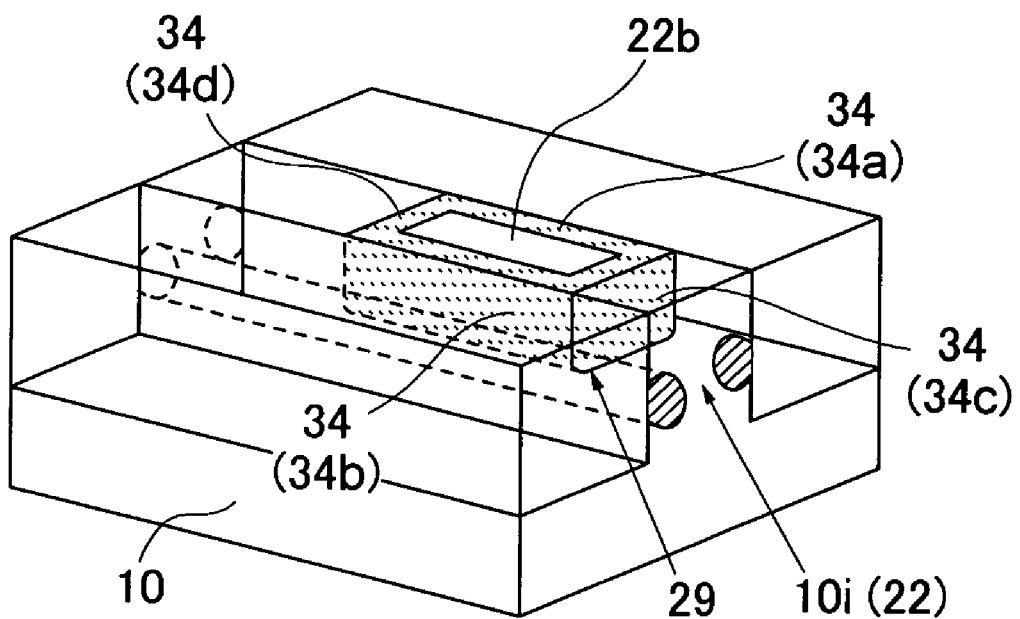
FIG. 33B shows the second gate electrode 35a removed form FIG. 33A.

FIG. 31 is a schematic plan view showing the structure of a semiconductor device 3 in a preferred second embodiment of the present invention. FIG. 32 is a schematic plan view showing the layout of the active region 10i in FIG. 31. FIG. 33A is a schematic perspective view for illustrating the structure of a MOS transistor, and FIG. 33B shows the second gate electrode 35a removed form FIG. 33A.

As shown in FIGS. 31, 32, and 33A and B, the semiconductor device 3 in the present embodiment has active regions provided on the semiconductor substrate 10, but it has island-shaped active areas 10i protruding in the direction perpendicular to the main surface, not fin-shaped active areas 10f extending in the direction Y. That is, unlike the semiconductor device 1 in the first embodiment, active regions are individually provided for each cell transistor TR. Thus, in each location where a cell transistor TR is formed, slits 29 formed substantially perpendicular to the main surface of the semiconductor substrate 1 are formed around the island-shaped active area 10i, and the first gate electrodes 34 are embedded in the slits 29. Four first gate electrodes 34 are thus allocated (four sides) for each cell transistor TR.

That is, the first gate electrodes 34 are composed of a first portion 34a covering a first side of the channel region 22, a second portion 34b covering a second side of the channel region 22, and third and fourth portions 34c and 34d covering third and fourth sides intersecting the first and second sides (see FIGS. 33A and B), and the channel region 22 is surrounded by these first through fourth portions 34a through 34d. Here, the first and second sides of the channel region 22 indicate sides substantially orthogonal to the direction in which the second gate electrodes 35a extend, and the third and fourth sides indicate sides substantially parallel to the direction in which the second gate electrodes 35a extend.

The second gate electrodes 35a are arranged planarly offset relative to the first gate electrodes 34. The region surrounded by the first gate electrodes 34 is thus composed of a portion covered by a second gate electrode 35a and a portion not covered by a second gate electrode 35a, and the upper surface of the portion not covered by a second gate electrode 35a is exposed. A cell contact which is a top electrode is connected to the exposed portion, and the cell contact and second diffusion layer 22b are thereby connected.

The above is a characteristic part of the semiconductor device 3 in the present embodiment. The rest of the structure is similar to that of the first embodiment, and the same symbols are therefore used for the same structural elements, which will not be further elaborated. Horizontally extending second gate electrodes 35a are thus also arranged planarly offset relative to the vertically extending first gate electrodes 34 in the semiconductor device 3 of the present embodiment, allowing the top of the channel region to be exposed while ensuring contact between the first gate electrodes 34 and the second gate electrodes 35a. A vertical type of MOS transistor gate electrode can thus be easily formed.

The semiconductor device 3 of the present embodiment has first gate electrodes 34 formed over the entire peripheral surface of the channel region 2, and has first and second portions 34a and 34b as well as third and fourth portions 34c and 34d, allowing broader channel area to be ensured and also allowing the on current of the transistor to be increased.

A manufacturing method of the semiconductor device 3 of the present embodiment will be described below.

FIGS. 34 through 43 are diagrams of steps for illustrating the manufacturing method of the semiconductor device 3 according to the second embodiment of the present invention, where A of each is a schematic cross sectional view along line A-A' in FIG. 31, B is a schematic cross sectional view along line B-B' in FIG. 31, C is a schematic cross sectional view along line C-C' in FIG. 31, D is a schematic cross sectional view along line D-D' in FIG. 31, and E is substantially a plan view.

In the manufacturing of the semiconductor device 3 according to the present embodiment, embedded wiring 21 and the element isolation region 16 are first formed by the same steps as in the first embodiment shown in FIGS. 1 through 17.

Then, as shown in FIGS. 34 and 35, additional element isolation regions 46 orthogonal to the existing element isolation regions 16 are formed.

In the formation of the additional element isolation regions 46, photolithography and dry etching are used to remove portions of the pad oxide films 11 and field nitride film 12 by dry etching (anisotropic etching) in regions where the element isolation regions 46 are to be formed. All of the resist is then removed by dry etching.

Then, as shown in FIG. 34, the semiconductor substrate 10 is dry etched using as a mask the field nitride film 12 and silicon oxide film 16b forming the element isolation regions 16, whereby approximately 150 nm deep trenches 44 are formed. At this time, it will be necessary to control the level of etching to prevent the trenches 44 from reaching the embedded wiring 21 in order to prevent increases in the resistance of the embedded wiring 21.

An approximately 5 nm thick silicon oxide film 45 is then formed by thermal oxidation on the inner walls of the trenches 44. A silicon oxide film 46b is then formed to about 500 nm on the entire surface of the substrate, including the interior of the trenches 44, by HDP-CVD.

The silicon oxide film 16b on the field nitride film 12 is then removed by CMP using the field nitride film 12 as a stopper and is flattened. The additional element isolation regions 46 are thus completed, as shown in FIG. 35.

However, it will not be possible to form the active regions of the peripheral circuit region in DRAM by the above process alone in this embodiment, in the same manner as in the first embodiment. When the diffusion layer of the peripheral circuit regions are formed, element isolation region trenches of about 250 nm may be formed by photolithography and dry etching in the above state, an approximately 10 nm silicon oxide film may be formed by thermal oxidation, and the silicon oxide film may then be embedded by HDP-CVD and flattened by CMP to produce active regions for forming transistors in peripheral circuit regions.

Then, as shown in FIG. 36, so as to ensure a difference in height of about 50 nm between the top surface of the silicon oxide films 16b and 46b forming the element isolation regions 16 and 46 and the upper surface of the semiconductor substrate 10, the silicon oxide films 16b and 46b are wet etched and then wet etched using approximately 160° C. hot phosphoric acid, and the field nitride film 12 used as a CMP stopper is removed. The pad oxide film 11 is not removed at this time.

Then, as shown in FIG. 37, a silicon nitride film 47 is formed on the entire surface of the substrate. The silicon nitride film 47 will serve as a mask during the formation of slits 53. It will be necessary to set the thickness of the silicon nitride film 47 to no more than half the width of the active region 10*i*. This may be set to about 25 nm, for example. Thus setting the silicon nitride film 47 to a suitable thickness will result in the formation of concave portions 48 with the silicon nitride film 47 between the element isolation regions 16 and 46.

Then, as shown in FIG. 38, an approximately 100 nm thick silicon oxide film 49 is formed over the entire surface of the substrate, and CMP is then performed using the silicon oxide film 47 as a stopper. As a result, the silicon oxide film 49 will be embedded in the concave portions 48 of the silicon oxide film 47.

Then, as shown in FIG. 39, a patterned photoresist 50 is formed by photolithography in such a way as to have openings 51 on diffusion layers used as channels and regions in which gate electrodes are to be formed.

Then, as shown in FIG. 40, the silicon nitride film 47 is removed by dry etching using the photoresist 50 as a mask. This will result in the removal of portions of the silicon nitride film 47 formed on the element isolation regions 16 as well as in the exposure of the silicon oxide film 16*b* along with the silicon oxide film 49. The silicon nitride film 47 formed on the additional element isolation regions 46 is covered by the photoresist 50 and is thus not removed. Portions of the silicon nitride film 47 formed in steps are removed from among the silicon nitride film 47 formed on the semiconductor substrate 10, resulting in the formation of slits 52 corresponding to the thickness of the silicon nitride film 47. The pad oxide film 11 will be exposed at the bottom of the slits 52. The photoresist left over after the silicon nitride film 47 has been etched is removed by dry etching.

Then, as shown in FIG. 41, the semiconductor substrate 10 is anisotropically dry etched using the silicon oxide film 16*b* and silicon oxide film 49 as masks, and approximately 125 nm deep slits 53 are formed in the active regions 10*i* on the semiconductor substrate 10. Prior to the etching, it will be necessary to etch the silicon oxide films and to remove the pad oxide film 11 exposed on the surface in order to expose the semiconductor substrate 10.

The silicon oxide film 16*b* and silicon oxide film 49 are then removed by wet etching using a solution containing hydrofluoric acid, and an approximately 5 nm thick silicon oxide film (sacrificial oxide film) is then formed (not shown) by thermal oxidation in the slits 53. The silicon nitride film 47 is then removed by wet etching using approximately 160° C. hot phosphoric acid. While the pad oxide film 11 remains, the semiconductor substrate 10 is furthermore thermally oxidized to thicken the pad oxide film 11. Thus a through oxide film for impurity implantation is formed. Impurities are then implanted to form channels and to form wells for transistors in memory cell region and peripheral circuit region, and heat treatment is performed for activation. After the implantation of impurities, the above through oxide film (pad oxide film 11) and silicon oxide film (sacrificial oxide film) formed in the slits 53 are again removed using a solution that includes hydrofluoric acid. As a result, the main surface of the semiconductor substrate 10 will become substantially flat, as shown in FIG. 42.

The subsequent steps are the same as in the first embodiment and will therefore be described briefly. First, as shown in FIG. 43, gate insulation films 30, first and second gate electrodes 34 and 35*a*, and dummy gate electrodes 35*b* are formed. Boron is implanted for channel regions of the memory cell transistor. When the polysilicon film 31 forming the gate electrodes is etched, the polysilicon embedded in the cell trench gate portions will be etched about 30 nm and deeply excavated in an over-etching step in the same manner as in the first embodiment.

Then, as shown in FIG. 44, a silicon nitride film 36 and silicon oxide film (not shown) are formed in sequence. A silicon nitride film (not shown) is furthermore formed to about 13 nm so as to improve the SAC (self align contact) margin during cell contact hole formation and form the film on TEOS-NSG film of the transistor in the peripheral circuit region.

Then, as shown in FIG. 45, a first interlayer insulation film 37 is formed. Contact holes 38 are formed by SAC through the first interlay insulation film 37, and the polysilicon film is used to fill the contact holes 38 and form cell contacts 39.

The semiconductor device 3 having cell array transistor with a fin structure is thereby completed. When the semiconductor device 3 in the present embodiment is formed as a DRAM memory cell array, conventional methods will be used to form peripheral transistor contacts, and bit lines, capacitors, and wiring (Al, Cu), etc. giving potential to all transistors or sites. A DRAM memory cell such as the one shown in FIG. 5 is thus complete. The capacitor C may also be directly formed on the cell contact 39, and may also be formed on another contact plug (such as capacitance contact plugs passing between bit lines) once it has been formed.

Figure 46:
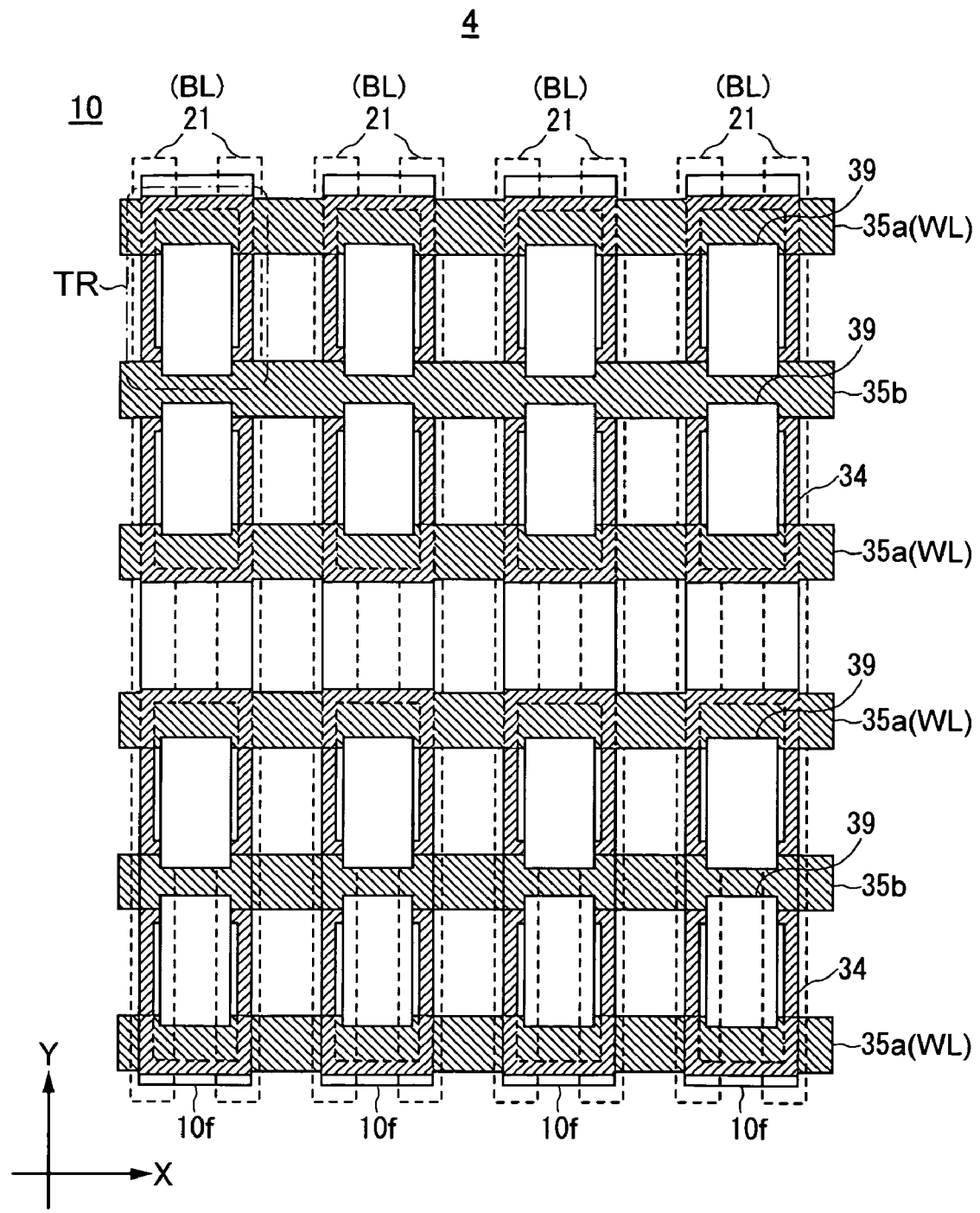
FIG. 46 is a plan view showing the structure of a semiconductor device 4 in a variant of the semiconductor device 3.

FIG. 46 is a plan view showing the structure of a semiconductor device 4 which is a variant of the semiconductor device 3.

As shown in FIG. 46, in the semiconductor device 4 in the present embodiment, the second gate electrodes 35*a* and dummy gate electrodes 35*b* are not alternatingly arranged. A dummy gate electrode 35*b* is interposed between two second gate electrodes 35*a* and 35*a*, and the cell transistors TR have a symmetrical lay out centered on the dummy gate electrode 35*b*. That is, the layout is the same as the semiconductor device 2 shown in FIG. 30. In the semiconductor device 3 in the second embodiment, as shown in FIG. 31, $8F^2$ cells in a symmetrical layout were used, but in the semiconductor device 4 of the variant, the cells can be changed to $6F^2$ cells to bring about further miniaturization. Furthermore, the first gate electrodes 34 surround the diffusion layer, thus allowing it to be anticipated that the on current will be greater than in the first embodiment.

The device structure of a semiconductor device using a phase change element instead of the capacitor C which is a DRAM memory element will be described below.

Figure 47:
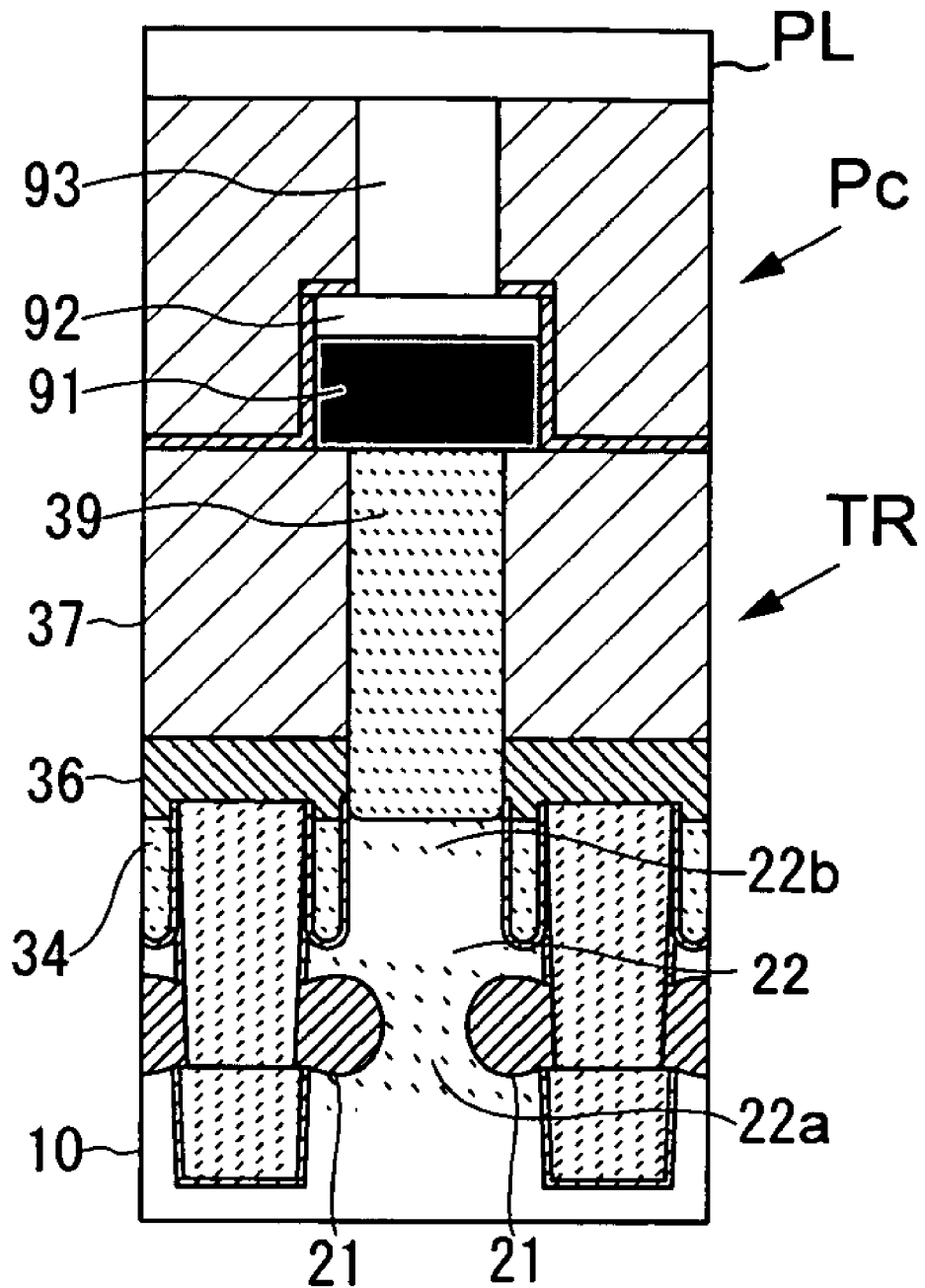
FIG. 47 is a schematic cross sectional view showing the device structure of a semiconductor device in another preferred embodiment of the invention.

FIG. 47 is a schematic cross sectional view showing the device structure of a semiconductor device in another preferred embodiment of the invention.

As shown in FIG. 47, the characteristic of the present embodiment is the use of a phase change element Pc as the memory element of the memory cell MC shown in FIG. 4. The phase change element Pc is composed of a bottom electrode (heater plug) 91 connected to the second diffusion layer 22*b* via cell contact 39, top electrode 93 connected to plate wiring PL, and a recording layer 92 provided between the bottom electrode 91 and top electrode 93.

A phase change material is used in the recording layer 92. The phase change material is preferably selected from, but not limited to, what are referred to as chalcogenide materials, as long as the material allows two or more phase configurations to be obtained, and the electrical resistance varies depending on the phase configuration. Chalcogenide materials refer to alloys including at least one element such as germanium (Ge), antimony (Sb), tellurium (Te), indium (In), and selenium (Se). Examples can include binary elements such as GaSb, InSb, InSe, $Sb_2Te_3$, and GeTe, ternary elements such as $Ge_2Sb_2Te_5$, InSbTe, GaSeTe, $SnSb_2Te_4$, and InSbGe, and quaternary elements such as AgInSbTe, (GeSn)SbTe, GeSB(SeTe), and $Te_{81}Ge_{15}Sb_2S_2$. The selection of $Ge_2Sb_2Te_5$ (GST) is particularly desirable in the present embodiment. Although the thickness of the recording layer 92 is not particularly limited, it can be set to between 10 and 200 nm, for example, in the present embodiment. Sputtering can be used as the method for forming the recording layer 92.

A heater plug is used as the bottom electrode 91, and serves as a part of a heating element when data is written. Materials with relatively high electrical resistance, such as metal silicides, metal nitrides, and metal silicide nitrides, are therefore preferably used as the material of the bottom electrode 91. Materials which can preferably be used include, but are not limited to, refractory metals, and nitrides thereof, such as W, TiN, TaN, WN, and TiAlN, or refractory metal silicide nitrides such as TiSiN and WSiN, as well as TiCN.

The top electrode 93 functions to protect the recording layer 92 when the recording layer 92 is patterned. Materials with relatively low heat conduction are preferably used as the material of the top electrode so that heat produced when electrical power is supplied will tend not to escape. Specifically, materials such as TiAlN, TiSiN, and TiCN can preferably be used in the same manner as for the bottom electrode 91.

The semiconductor device having the structure noted above is capable of writing and reading data through the activation of any one of the plurality of word lines WL by a word driver (not shown) and the flowing of current to at least one of the bit lines in that state. That is, in a memory cell MC in which a corresponding word line has been activated, the cell transistor TR is turned on, and the corresponding bit line is thus connected to the bit line BL via the phase change element Pc. Thus, when writing current flows to a certain bit line BL in this state, the recording layer 92 included in the phase change element Pc can be changed to a crystal phase or amorphous phase. Also, when reading current flows to the bit line BL, the current level will vary depending on whether the recording layer 92 included in the phase change element Pc is a crystal phase or amorphous phase, thus allowing the data to be read on that basis.

Figure 48:
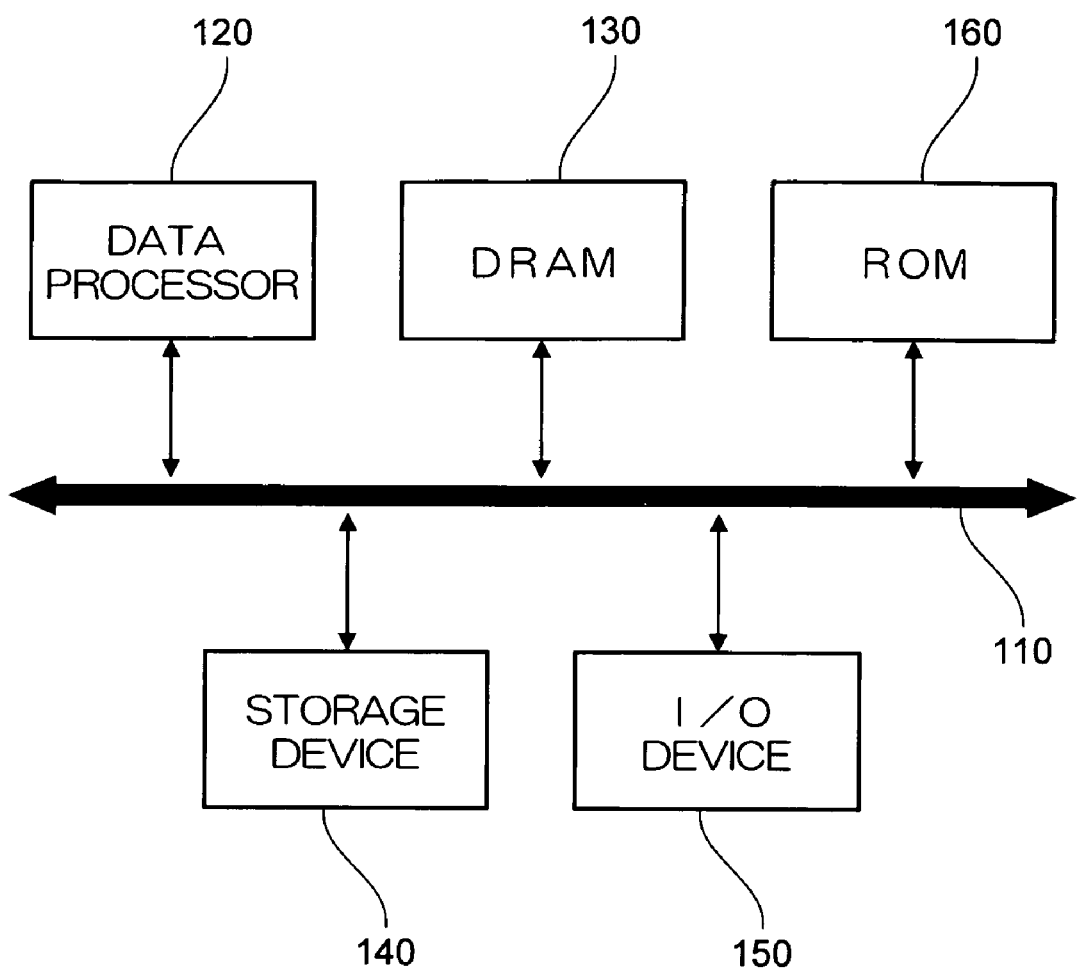
FIG. 48 is a block diagram showing the structure of a data processing system 100 employing the semiconductor device according to a preferred embodiment of the invention, showing a case in which the semiconductor device according to the present embodiment is DRAM.

FIG. 48 is a block diagram showing the structure of a data processing system 100 employing the semiconductor device according to a preferred embodiment of the invention, showing a case in which the semiconductor device according to the present embodiment is DRAM.

The data processing system 100 shown in FIG. 48 has a structure in which a data processor 120 and a semiconductor device (DRAM) 130 according to the present embodiment are connected to each other via a system bus 110. Examples of the data processor 120 include, but are not limited to, microprocessors (MPU) and digital signal processors (DSP). For the sake of convenience, the data processor 120 and DRAM 130 are connected via the system bus 110 in FIG. 48, but they may be connected by a local bus instead of a system bus 110.

In FIG. 48, only one system bus 110 has been drawn for the sake of convenience, but buses may be provided in series or in parallel via connectors or the like as needed. Also, in the memory system data processing system shown in FIG. 48, a storage device 140, I/O device 150, and ROM 160 are connected to the system bus 110, but these are not necessarily essential structural elements.

Examples of the storage device 140 include hard disk drives, optical disk drives, and flash memory. Examples of the I/O device 150 include display devices such as liquid crystal displays, or input devices such as a keyboard or mouse. The I/O device 150 may be just either an input device or output device. Each of the structural elements shown in FIG. 48 have been drawn for the sake of convenience but are not limited to what has been drawn, and a plurality of one or more structural elements may be provided.

It is apparent that the present invention is not limited to the above embodiments, but may be modified and changed without departing from the scope and spirit of the invention.

For example, in the above embodiments, cell contacts 39 were formed by immediately embedding a polysilicon film containing an abundance of phosphorus (P) after the formation of the contact holes 38, but in order to reduce contact resistance, a silicon film may first be epitaxially grown about 50 nm after the formation of the contact holes 38, impurities such as phosphorus (P) or arsenic (As) may be implanted to a high concentration (such as about $1.0 \times 10^{15}$ cm$^{-3}$) in the silicon film, and a polysilicon film may furthermore be embedded.

The materials for embedding the contact holes 38 are also not limited to polysilicon films. For example, a silicide film such as tungsten silicide ($WSi_2$) or cobalt silicide ($CoSi_2$) or a refractory metal such as tungsten (W) may be used to lower the resistance of the cell contacts 39. However, when a refractory metal is used, it will be necessary to use a barrier metal such as titanium nitride (TiN), tungsten nitride ($WN_2$), or tantalum nitride (TaN) to prevent the metal from diffusing. Also, when the above silicide films or refractory metals are used, the formation of the contact holes 38 will preferably be followed first by the epitaxial growth of a silicon film to about 50 nm and the implantation of impurities such as phosphorus (P) and arsenic (As) to a high concentration (such as about $1.0 \times 10^{15}$ cm$^{-3}$) in the silicon film in order to reduce the contact resistances.

What is claimed is:

1. A semiconductor device, comprising:
   a channel region extending substantially perpendicular to a main surface of a semiconductor substrate;
   a first diffusion layer provided on a bottom of the channel region;
   a second diffusion layer provided on a top of the channel region;
   a bottom electrode connected to the first diffusion layer, the bottom electrode being embedded in a cavity within the channel region, along a side thereof;
   a first gate electrode that extends substantially perpendicular to the main surface of the semiconductor substrate and that is provided on a side of the channel region through a gate insulation film; and
   a second gate electrode that extends substantially parallel to the main surface of the semiconductor substrate and that is connected to the top of the first gate electrode,
   wherein a planar position of the second gate electrode is offset relative to a planar position of the first gate electrode.

2. The semiconductor device as claimed in claim 1, wherein the channel region has first and second sides substantially orthogonal to a direction in which the second gate electrode extends, and
   the first gate electrode includes a first portion for covering the first side of the channel region and a second portion for covering the second side of the channel region.

3. The semiconductor device as claimed in claim 2, wherein the semiconductor substrate has an island-shaped active region protruding in a direction perpendicular to the main surface; and the channel region is formed in the island-shaped active region.

4. The semiconductor device as claimed in claim 3, wherein the channel region further has third and fourth sides substantially orthogonal to the first and second sides; and
the first gate electrode further includes a third portion for covering the third side of the channel region and a fourth portion for covering the fourth side of the channel region.

5. The semiconductor device as claimed in claim 1, wherein the semiconductor substrate has a fin-shaped active region intersecting the second gate electrode; and the channel region is formed in the fin-shaped active region.

6. The semiconductor device as claimed in claim 5, wherein a slit substantially perpendicular to the main surface of the semiconductor substrate is formed in the fin-shaped active region of the semiconductor substrate; and the first gate electrode is embedded in the slit.

7. The semiconductor device as claimed in claim 1, wherein the bottom electrode that is connected to the first diffusion layer intersects with the second gate electrode.

8. The semiconductor device as claimed in claim 7, wherein the bottom electrode comprises a first bottom electrode in a first cavity within the channel region, on a first side thereof, the semiconductor device further comprising a second bottom electrode connected to the first diffusion layer, the second bottom electrode being embedded in a cavity within the channel region, along a second side thereof opposite to the first side.

9. The semiconductor device as claimed in claim 1, further comprising a top electrode connected to a portion that is exposed by the offset of the first gate electrode and the second gate electrode in the second diffusion layer.

10. The semiconductor device as claimed in claim 9, further comprising a cell capacitor connected to the second diffusion layer through the top electrode.

11. The semiconductor device as claimed in claim 1, further comprising a dummy gate electrode provided between adjacent second gate electrodes, wherein reverse bias is applied to the dummy gate electrode.

* * * * *